(12) United States Patent
Suematsu

(10) Patent No.: US 6,252,469 B1
(45) Date of Patent: Jun. 26, 2001

(54) MICROWAVE/MILLIMETER-WAVE INJECTION/SYNCHRONIZATION OSCILLATOR

(75) Inventor: Eiji Suematsu, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/297,935

(22) PCT Filed: Nov. 7, 1997

(86) PCT No.: PCT/JP97/04060

§ 371 Date: May 11, 1999

§ 102(e) Date: May 11, 1999

(87) PCT Pub. No.: WO98/21828

PCT Pub. Date: May 22, 1998

(30) Foreign Application Priority Data

Nov. 11, 1996 (JP) .................................... 8-296978
Oct. 8, 1997 (JP) .................................... 9-275662

(51) Int. Cl.$^7$ ........................................ H03B 5/18
(52) U.S. Cl. .................. 331/117 D; 331/96; 331/172; 331/177 V
(58) Field of Search ................. 331/96, 117 D, 331/172, 177 V

(56) References Cited

U.S. PATENT DOCUMENTS

| 4,219,779 | * | 8/1980 | Shinkawa et al. | 455/321 |
| 4,320,360 | * | 3/1982 | Thomas | 331/172 |
| 4,356,456 | * | 10/1982 | Uzunoglu | 331/117 R |
| 4,737,737 | * | 4/1988 | Khanna | 331/47 |

FOREIGN PATENT DOCUMENTS

| 0 626 762 | 11/1994 | (EP) . |
| 53-89347 | 8/1978 | (JP) . |
| 55-110434 | 8/1980 | (JP) . |
| 55-110435 | * | 8/1980 | (JP) . |
| 55-147836 | 11/1980 | (JP) . |
| 59-151538 | 8/1984 | (JP) . |
| 62-47212 | 2/1987 | (JP) . |
| 1-268217 | 10/1989 | (JP) . |
| 2-215206 | 8/1990 | (JP) . |
| 2-134718 | 11/1990 | (JP) . |
| 6-152243 | 5/1994 | (JP) . |
| 6-311026 | 11/1994 | (JP) . |
| 8-250930 | 9/1996 | (JP) . |

OTHER PUBLICATIONS

"Millimeter–Wave HBT 1–3, 7 MMIC Synthesizers Using Subharmonically Injection–Locked Oscillators", Eiji Suematsu et al., IEEE Gallium Arsenide Integrated Circuit Symposium, IEEE, vol. 19, pp. 271–274, Oct. 12, 1997.
Patent Abstract of Japan, 62 047212 A, Feb. 28, 1987.
Patent Abstract of Japan, 01 268217 A, Oct. 25, 1989.

* cited by examiner

Primary Examiner—David Mis

(57) ABSTRACT

In a microwave/millimeter-wave injection locked oscillator, an oscillation circuit (15) has an active element section (1), a resonant circuit (4) connected with the active element section (1) at one side thereof and resonating at predetermined frequency f, and a harmonic output circuit (3) connected with the active element section (1) at the other side thereof and providing a signal having an nth (n: an integer $\geq 2$) harmonic component of the signal having the frequency f from the resonant circuit (4). An injection circuit (16) is connected with the oscillation circuit (15) via an input terminal (7). A reference signal having a frequency component of f/m (m integer) is injected through the input terminal (7) into the resonant circuit (4), whereby signals in the resonant circuit (4) are frequency-locked to the reference signal. The injection circuit (16) can use a crystal oscillator for a stable low frequency. This arrangement allows the frequency to be easily converted up to the millimeter wave band, reduces unnecessary wave signals, and widens the variable range of the frequency.

17 Claims, 13 Drawing Sheets

MICROWAVE/MILLIMETER-WAVE INJECTION/SYNCHRONIZATION OSCILLATOR

This application is the national phase under 35 U.S.C. §371 of PCT International Application No. PCT/JP97/04060 which has an International filing date of Nov. 7, 1997, which designated the United States of America.

TECHNICAL FIELD

The present invention relates to light and small-sized microwave/millimeter-wave injection locked oscillators for wireless communications, which have a good frequency stability and a high signal purity.

BACKGROUND ART

As the information content has increased in recent years, people have come to pay attention to personal communications in which a large volume of analog and digital information is transmitted at a high speed by radio by using high-frequency carriers such as microwaves or millimeter waves. In such communications, there is a demand for development of compact and light microwave and millimeter-wave signal generators having good frequency stability and little phase noise.

A conventional injection locked microwave signal generator is shown in FIG. 14. The injection locked microwave signal generator is made up of a microwave and millimeter-wave amplifier 650 which operates at a fundamental oscillation frequency f', a positive feedback loop 651 consisting of a delay line 652 and a combiner/divider 653, and a microwave and millimeter-wave amplifier 655. In an operation at a free oscillation time, first, a random noise inside the positive feedback loop 651 is amplified by the amplifier 650, so that the noise level of the fundamental oscillation frequency f' becomes high, and the random noise circulates through the positive feedback loop 651. During repetition of the above process, owing to a signal of the fundamental oscillation frequency f' and non-linearity of the amplifier 650, harmonic components n×f' (n: integer) of the fundamental oscillation frequency f' grow at a frequency at which the phase rotational angle of the positive feedback loop 651 becomes 360°. Thus, in a steady state, a signal of the fundamental oscillation frequency f' and its harmonics n×f' (n: integer) are generated.

Then, by forcibly injecting a signal component having a stable frequency fo (fo=f/m (m: integer)) and a reduced phase noise from the input terminal 660 through the microwave and millimeter wave amplifier 650, the signal having the free fundamental oscillation frequency f' is locked to a signal having a frequency f which is m times the frequency fo of the injection signal. In this manner, it is possible to reduce the phase noise of the free fundamental oscillation frequency f' and stabilize the frequency.

The operation is described below. The forced signal fo injected from the outside causes the signal having the frequency f, which is fo×m, to be generated owing to the non-linearity of the microwave and millimeter wave amplifier 655. When the free fundamental oscillation frequency f' is located in the neighborhood of the harmonic fo×m of the injection signal (f'≅f), the signal of the free fundamental oscillation frequency f' is pulled in the harmonic fo×m (m: integer) of the injection signal into a signal locked to the harmonic signal fo×m. Then, the signal is outputted from the output portion 670. Thus, it is possible to reduce the phase noise of the fundamental oscillation frequency f' and stabilize the frequency.

In the method shown in FIG. 14, the phase is controlled by a line length of the positive feedback loop 651 including the delay line 652 and the combiner/divider 653, and the fundamental oscillation frequency f' is determined. When the frequency f' becomes high, the line length of the positive feedback loop 651 becomes short and it becomes difficult to control the fundamental oscillation frequency f'. In such a circuit construction, owing to the characteristic of transmission between D and C of the combiner/divider 653, the injection signal inputted thereto through the amplifier 655 is outputted to the output terminal 670. Thus, the signal taken out from the output terminal 670 includes not only a desired wave but also many undesired waves. Further, basically, the fundamental oscillation frequency f' cannot be varied, although changing the bias point of the amplifier 650 allows the frequency to be slightly changed.

The fundamental oscillation frequency f' can be varied by setting the Q value of the positive feedback loop 651 to a small value thereby to widen the locking range at the injection locking time. But when the Q value of the circuit is small, the fundamental oscillation frequency f' becomes unstable owing to influence by an environmental temperature and other factors. In this case, locking achieved by the signal injection becomes off when the locking range is exceeded. A stable injection locking can be achieved only in the vicinity of the center of the locking range. For such a reason, the circuit construction as mentioned above has problems that it is difficult to obtain a high-frequency wave such as millimeter waves, reduce signals including undesired waves, and vary frequencies.

DISCLOSURE OF THE INVENTION

Therefore, it is a primary object of the present invention to provide an microwave/millimeter-wave injection locked oscillator capable of reducing signals including undesired waves, widening the variable range of frequencies, and easily providing a high-frequency wave such as a millimeter wave.

It is a further object of the present invention to enable such a microwave/millimeter-wave injection locked oscillator to reliably generate a stable signal with a low noise, by making the phase constant in the locking range.

In order to achieve the above primary object, according to the present invention, without constituting a positive feedback loop, a reflection type voltage control oscillator capable of controlling a fundamental oscillation frequency f' is prepared, which oscillator has a series arrangement in which a signal is directly injected into an active element section through a resonator.

That is, the present invention provides an microwave/millimeter-wave injection locked oscillator comprising an oscillation circuit having an active element section, a resonant circuit connected with the active element section at one side thereof and resonating at a predetermined frequency f, and a harmonic output circuit connected with the active element section at the other side thereof to fetch a signal having an nth (n: an integer) harmonic component of a signal having the frequency f from the resonant circuit; an injection circuit generating a reference signal for frequency-locking a signal in the resonant circuit; and an input means for inputting the reference signal to the resonant circuit.

In an embodiment, the resonant circuit includes a transmission line and a capacitance element. The input means is provided at one end of the transmission line or the capacitance element. The reference signal has a frequency component of f/m (m: an integer).

The injection circuit may include a crystal oscillator of a low frequency.

The injection circuit may have a signal generator and a wide-band non-linear amplifier having an amplification degree between a frequency of f/m and a frequency of nf.

The injection circuit may further comprise an h-multiplier (h: an integer) connected between the signal generator and the wide-band non-linear amplifier.

On the other hand, the capacitance element of the resonant circuit may be made up of two varactor diodes connected in series with each other in reverse orientations. Then, a signal outputted from the injection circuit is injected into a node between the two varactor diodes.

Alternatively, the capacitance element of the resonant circuit may be constituted of a microwave transistor between two terminals thereof, and a signal outputted from the injection circuit may be injected into the other terminal.

Further, the capacitance element of the resonant circuit may be constituted of two microwave transistors in which collector terminals and base terminals thereof are commonly connected, one emitter terminal is connected with a transmission line, and the other emitter terminal is grounded. Then, a signal outputted from the injection circuit is injected into the commonly connected collector terminals and base terminals.

According to the microwave/millimeter-wave injection locked oscillator of the present invention having the above construction, the nth harmonic of the fundamental wave having the fundamental oscillation frequency is used as the output signal. Thus, in order to generate an injection signal, it is possible to use a phase locking oscillator which is used in digital wireless communications in the radio spectrum such as UHF and which is highly stable and has a low phase noise characteristic. Thus, it is possible to construct a compact millimeter wave injection locked oscillator at a low cost. Furthermore, it is unnecessary to oscillate to directly generate a signal of the millimeter wave band. For example, if a fourth harmonic is used, it is possible to output a signal of 60 GHz with a fundamental oscillation at 15 GHz. In addition, by making use of the non-linearity of the oscillation circuit, the amplifier, and the multiplier, it is possible to widen an injection locking frequency range. In addition, it is possible to considerably widen the range of the frequency variation by electrically controlling the free oscillation frequency by the variable capacitance element while the injection locking is being controlled at the same time. Further, unnecessary wave components generated through the non-linear operation of the wide-band amplifier and that of the multiplier are suppressed in the injection locking process and are hardly outputted to the output portion. Thus, it is unnecessary to provide filters for removing such unnecessary signal components.

In order to achieve the further object of the present invention, in the present invention, a frequency negative feedback loop as described below is constructed to control a free oscillation frequency of a voltage control oscillator (VCO) so as to be locked to a frequency of a reference signal source. Thereby, when the frequency of the injection signal is varied within the injection locking range, it is possible to allow a free oscillation frequency of an output signal to follow the frequency of the injection signal. Thus, it is possible to always keep the phase of the injection signal and that of an injection locked signal in a constant relationship and widen the injection locking range. The construction of a microwave/millimeter-wave injection locked oscillator according to an embodiment of the present invention is as follows:

That is, in the embodiment, the injection circuit further has a reference signal generator generating the reference signal, and a branching filter provided at an output side of the resonant circuit. This injection locked oscillator further comprises a frequency negative feedback loop having a frequency mixer to which a signal outputted from the branching filter and a signal outputted from the reference signal generator are inputted. The frequency negative feedback loop feeds back an error signal outputted from the frequency mixer to the resonant circuit to thereby frequency-lock the resonant circuit to a signal outputted from the reference signal generator.

This microwave/millimeter-wave injection locked oscillator has the frequency negative feedback loop to lock the free oscillation frequency of the resonant circuit to the frequency of the reference signal generated by the reference signal generator. Thus, even if the frequency of the injection signal is varied within the injection locking range, it is possible to allow a free oscillation frequency of an output signal of the resonant circuit to follow the frequency of the injection signal. Thus, it is possible to always keep the phase of the injection signal and that of an injection locked signal in a constant relationship with each other.

Thus, the injection locked oscillator may be used as a signal source for detecting a locking. Further, it is possible to stabilize the output signal of an nth harmonic, reduce a phase noise, and suppress an undesired spurious signal. Further, the injection locking range can be widened.

Furthermore, the phase noise and a pull-in time are controlled not by a loop filter or a low-pass filter but by an injection locking method. Thus, it is possible to accomplish a high-speed pull-in and reduction of phase noise and to widen a frequency-variable range.

The microwave/millimeter-wave injection locked oscillator may have a distributor which distributes the signal outputted from the reference signal generator to the input means and the frequency mixer.

In this case, the signal outputted from the reference signal generator is distributed by the distributor to the input means and the frequency mixer so as to serve for both the injection locking operation and the frequency negative feedback looping.

The frequency negative feedback loop may have an m-multiplier connected between the distributor and the frequency mixer.

In this construction, the frequency of the reference signal generated by the reference signal generator is multiplied by m by the m-multiplier before the signal is inputted to the frequency mixer. Thus, it is possible to utilize, as the reference signal generator, a phase locking oscillator that is used in digital radio communications using, for example, a semi-microwave and that has a high degree of stability and a low phase noise characteristic. Thus, it is possible to construct the reference signal generator in a small size and at low costs and thereby realize an inexpensive small-sized frequency synthesizer.

If the oscillation circuit has an nth harmonic matching circuit connected with the branching filer for fetching an nth harmonic from the resonant circuit, it is possible to fetch or take out the nth harmonic of the reference signal at a maximum output from the nth harmonic matching circuit.

The microwave/millimeter-wave injection locked oscillator may have an hth harmonic amplifier connected between the reference signal generator and the distributor.

In this case, the hth harmonic amplifier, which is positioned before resonant circuit, receives a signal from the reference signal generator and generates an hth harmonic of the signal. Thus, it is possible to increase the output efficiency of the generated harmonic. In addition, it is possible to reduce the operation frequency of the reference signal generator and thereby accomplish cost reduction.

Further, in addition to the hth harmonic amplifier, it is possible to connect an m-multiplier between the distributor and the frequency mixer.

In this case, the m-multiplier multiplies the frequency of the hth harmonic outputted from the hth harmonic amplifier by m. Thus, it is possible to increase the locking frequency and thereby increase the frequency of the output signal from the oscillation circuit.

Further, the hth harmonic amplifier may be connected between the distributor and the input means, and a frequency divider may be connected between the branching filter and the frequency mixer.

In this construction, because the hth harmonic amplifier is connected between the distributor and the input means, a reference signal is provided to the frequency negative feedback loop before the signal is inputted to the hth harmonic amplifier, while the hth harmonic outputted from the hth harmonic amplifier is provided to the oscillation circuit. The harmonic outputted from the branching filter is frequency-divided by the frequency divider into a lower frequency, which is then provided to the frequency mixer.

Accordingly, in the present invention, it is possible to reduce the operation frequency of the frequency mixer without reducing the oscillation frequency of the oscillation circuit and manufacture the frequency negative feedback loop easily and inexpensively.

BEST MODE FOR CARRYING OUT THE INVENTION

The embodiments of the present invention will be described below based on the accompanying drawings.

FIRST EMBODIMENT

Figure 1:
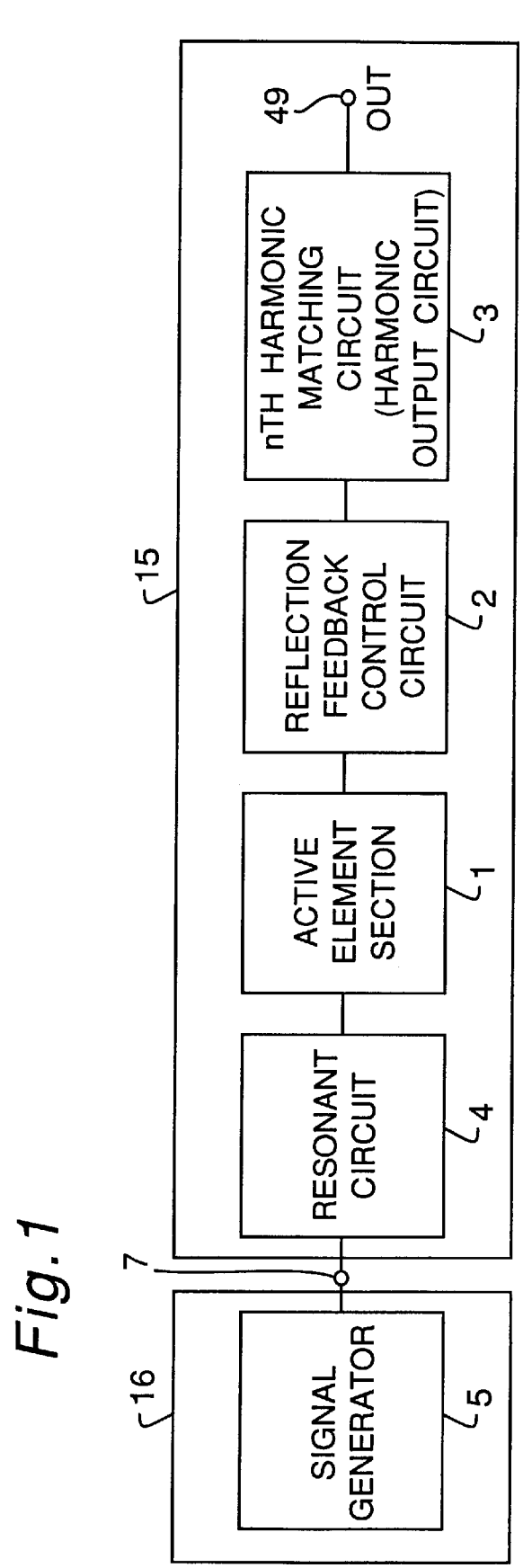
FIG. 1 shows an example of the fundamental construction of a first embodiment of the microwave/millimeter-wave injection locked oscillator of the present invention.

FIG. 1 shows the fundamental construction of a first embodiment of the injection locked oscillator of the present invention. The circuit of the present invention is constructed essentially of an oscillation circuit 15 and an injection circuit 16. In the oscillation circuit 15, an active element section 1 having a negative resistance component at a frequency f is connected with a reflection feedback control circuit 2 for controlling a reflection feedback gain of the frequency f and then with an nth harmonic matching circuit 3 for fetching or taking out a signal having a harmonic component n×f (n: an integer). Further, the active element section 1 is connected with a frequency-variable resonant circuit (hereinafter referred to as simply "resonant circuit") 4 constituted of a varactor capacitance element and a transmission line and resonating at the frequency f. A signal generator 5 in the injection circuit 16 is intended to inject a signal of a frequency component f/m (m: an integer) as a reference signal for the frequency locking into the resonant circuit 4. A signal input terminal 7 is provided at an end of the transmission line or the capacitance element of the resonant circuit 4 to receive the injected signal having the frequency component f/m (m: integer).

In a free oscillation time, the construction allows a free oscillation frequency f' to be variable by not only a bias voltage of a negative resistance element but also the varactor element. In this construction, however, the degree of frequency stability of a free oscillation signal (of frequency f') in the microwave band and the millimeter wave band is much lower than the degree of frequency stability of a crystal oscillator, because a Q value of the resonant circuit 4 cannot be set high, in particular in a monolithic circuit.

In the embodiment, a signal generator high in signal purity, such as a semi-microwave—microwave phase locking oscillator having a crystal oscillator, is used as the signal generator 5 for generating a signal having the frequency f/m. The signal of the frequency f/m outputted from the signal generator 5 is applied or injected to the resonant circuit 4 through the signal input terminal 7 to generate an ith (i: an integer) harmonic (f/m)×i of the frequency f/m of the injection signal, owing to the non-linearity of the oscillation circuit 15. At the same time, a free fundamental oscillation frequency fx of the oscillator located in the vicinity of the frequency f or an nth harmonic component of the free fundamental oscillation frequency f', namely, n×f', is pulled in the component of harmonic (f/m)×i of the injection signal to be locked. The locked harmonic signal n×f is outputted from an output portion 49 through the nth harmonic matching circuit 3. The nth harmonic matching circuit 3 constitutes the harmonic output circuit recited in the appended claims. The above construction is capable of increasing the degree of frequency stability in the microwave/millimeter wave band oscillator up to the level of the crystal oscillator and also reducing phase noise of the oscillator.

In addition, as the output signal (frequency: n×f), the nth harmonic of the signal having the fundamental oscillation frequency is used. Thus, it is unnecessary for the oscillation circuit 15 to oscillate to directly generate a signal of the millimeter wave band (for example, 60 GHz). For example, when a fundamental oscillation occurs at 15 GHz and a fourth harmonic is used, it is possible to output a signal of 60 GHz. In addition, owing to the non-linearity of the oscillation circuit 15, the locking frequency range at the time of the injection locking can be increased to be (m×n) times as wide because it corresponds to being multiplied by m×n as viewed from the frequency f/m of the injection signal. In addition, in the present invention, the free oscillation frequency f' can be varied by the varactor element. Thus, by electrically controlling the free oscillation frequency f', it is possible to control the injection locking that contributes to the frequency variability. Thus, it is possible to considerably widen the variable range of the frequency.

In the description made above, a varactor variable capacitance element is used in the resonant circuit 4. Alternatively, it is possible to use a fixed capacitance element to construct the injection locked oscillator of the present invention. In this case, however, the function of varying the free oscillation frequency is performed by only the bias voltage of the active element section 1.

Figure 2:
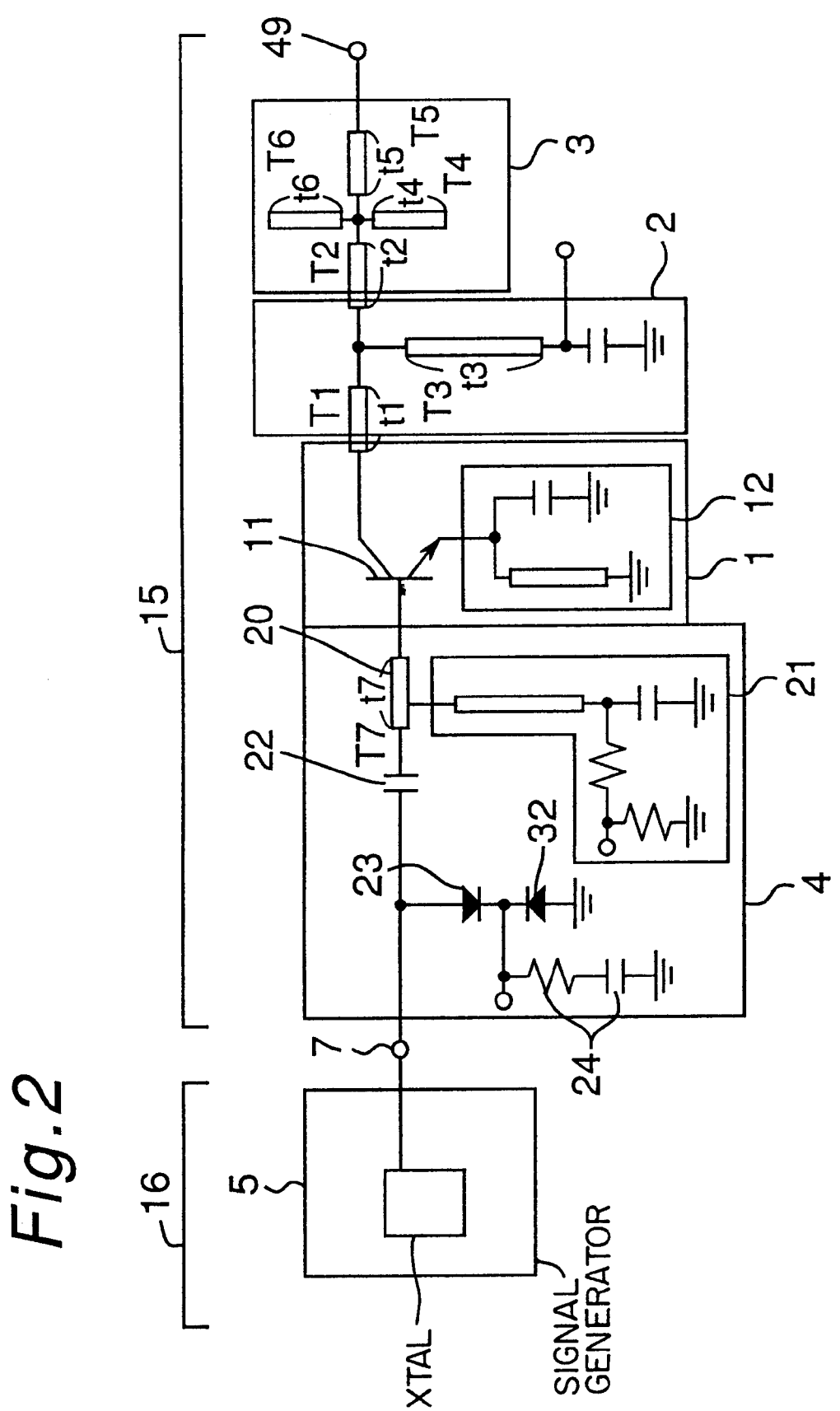
FIG. 2 shows an example of the circuit construction of the embodiment of FIG. 1.

FIG. 2 shows an example of the construction of the circuit of the embodiment. Parts of FIG. 2 same as those of FIG. 1 are designated by the same reference numerals as those of FIG. 1. The microwave/millimeter-wave injection locked oscillator of the present invention is constructed of the oscillation circuit 15 and the injection circuit 16 for outputting an injection signal to the oscillation circuit 15.

The oscillation circuit 15 will be described below. The oscillation circuit 15 is constructed of the active element section 1 having a negative resistance component at the frequency f, the reflection feedback control circuit 2 to control the reflection feedback gain of the frequency f, the nth harmonic matching circuit 3 serving as a harmonic output circuit for fetching signals having the harmonic components n×f (n: an integer) of the signal having the frequency f, the resonant circuit 4, and the output portion 49. The active element section 1 having a negative resistance component at the frequency f is made up of a microwave transistor 11 such as an FET, HEMT or HBT, and a series feedback element 12 comprising an MIM capacitor and a short stub. So long as the active element section 1 is allowed to have the negative resistance component at the frequency f, any one of the FET, the HEMT, and the HBT may be used as the microwave transistor 11. In the case of a unipolar transistor such as the FET or the HEMT, any one of source grounding, gate grounding, and drain grounding can be used as the grounding method. On the other hand, in the case of the HBT, a bipolar transistor, any one of emitter grounding, base grounding, and collector grounding may be used. In the present embodiment, the emitter grounding of the HBT is used. In the embodiment, characteristic impedance of 50Ω is used for a transmission line of each circuit but not limited to 50Ω. In the embodiment, description will be made on the case where the free oscillation frequency f' is about 15 GHz, and a fourth (n=4) harmonic signal having a frequency of 60 GHz is outputted to a load circuit of 50Ω.

The reflection feedback control circuit 2 controlling the reflection feedback gain of the frequency f includes a bias circuit for the transistor, which is constructed of T-type distributed constant lines T1, T3, and T3. The lengths t1, t2, and t3 of each of the distributed constant lines depend greatly on the oscillation frequency and performance of the transistor. But, to obtain a reflection gain exceeding or overcoming a line loss of the resonant circuit 4, the output impedance of the microwave transistor 11 is controlled by the lengths t1 and t3 of the distributed constant lines. The nth harmonic matching circuit 3 for fetching the signal having the harmonic component of 4×15 GHz (n=4) is constructed of distributed constant transmission lines T2, T4, T5, and T6 including an open stub, respectively. The lengths t2, t4, t5, and t6 of each of the transmission lines are adjusted so that they match an output load 50Ω at 60 GHz. In the embodiment, the open stubs T4 and T6 of balance type are used. But only one of the open stubs T4 and T6 can be used. Further, the nth harmonic matching circuit 3 may include a short stub instead of the open stub.

The resonant circuit 4 includes a transmission line T7, a bias supply circuit 21 for the microwave transistor 11, a DC cut-off capacitor 22, variable capacitance elements 23 and 32, and a bias circuit 24 connected with the variable capacitance elements 23 and 32. The length t7 of the transmission line T7 is about ¼ of a wavelength, including the length of the DC cut-off capacitor 22. The signal input terminal 7 is provided at an end of the transmission line T7 or at an end of the capacitance element 23. Through the signal input terminal 7, the resonant circuit 4 is connected with the injection circuit 16 for injecting the signal having the frequency component f/m (m: integer) into the resonant circuit 4. In FIG. 2, two (twin) varactor diodes 23 and 32 are used as the variable capacitance element by connecting them in series and in reverse orientations. But only one varactor diode 23 may be used. Further, a variable capacitance function of a transistor may be used.

Next, the injection circuit 16 will be described below. The injection circuit 16 is constructed of the signal generator 5. In the embodiment, as the injection signal, a signal of 7.5 GHz is used. At this time, the output impedance Zs of the signal generator 5 is: Zs≈50Ω. In the embodiment, the signal of 7.5 GHz is used. Alternatively, a signal of 15 GHz/3 (=5 GHz) may be used as the injection signal, the injection circuit 16 may be constructed accordingly. But when a constant injection signal output electric power is inputted, as a value of m increases, a locking frequency range decreases with respect to the fundamental oscillation frequency f', and an unlocking m value is present. The unlocking frequency depends mainly on the cut-off frequency performance of the microwave transistor 11.

Then, the operation of the above example will be described below. Upon applying an appropriate bias to the microwave transistor 11 of the active element section 1, a reflection gain is generated by the negative resistance component, an oscillation starts, then the oscillation becomes steady at the frequency f' at which a phase satisfies the condition of an electric length 2NΠ (N: integer) inside the resonant circuit 4, and then a free oscillation state is generated. In the free oscillation time, it is possible to vary the free oscillation frequency f' by the bias voltage of the microwave transistor 11 and the control voltage of the varactor elements 23 and 32. In this case, the degree of stability of the free oscillation signal (frequency f'=neighborhood of 15 GHz) of the microwave band/millimeter wave band is much lower than the stability degree of the crystal oscillator, because the Q value of the resonant circuit 4 cannot be set high particularly when the oscillator circuit is monolithic. In the embodiment, a microwave phase locking oscillator 5 having a crystal oscillator is used as the signal generator for generating a signal having a frequency 7.5 GHz (f=15 GHz, m=2). The generated signal is supplied to the resonant circuit 4 as the injection signal through the signal input terminal 7. At this time, owing to the nonlinearity of the oscillation circuit 15, the first, second, third, fourth, and the subsequent harmonics of the injection signal having the frequency 7.5 GHz are generated. At the same time, the free oscillation frequency f' (neighborhood of 15 GHz) of the oscillation circuit 15 and its first, second, third, fourth, . . . harmonics are pulled in and locked to the corresponding harmonics of 7.5 GHz×(1, 2, 3, 4, . . . ) to become frequencies of 15.0 GHz×(1, 2, 3, 4, . . . ). In the embodiment, the locked harmonic signals are outputted from the output portion 49 as signals of 60.0 GHz through the nth harmonic output matching circuit 3 having a fourth harmonic matching circuit.

The above construction is capable of increasing the degree of frequency stability of the microwave band/millimeter wave oscillator to the level of the crystal oscillator and also reducing the phase noise of the oscillator. Further, it is possible to increase the frequency-variable width in a 60 GHz band to eight times because the locking frequency range at the injection locking time is multiplied by 2×4 owing to the non-linearity of the active element section 1. In addition, it is possible to widen the variable range of the frequency greatly by controlling the free oscillation frequency electrically by the variable capacitance elements 23 and 32 while the injection locking is being controlled at the same time.

Figure 3:
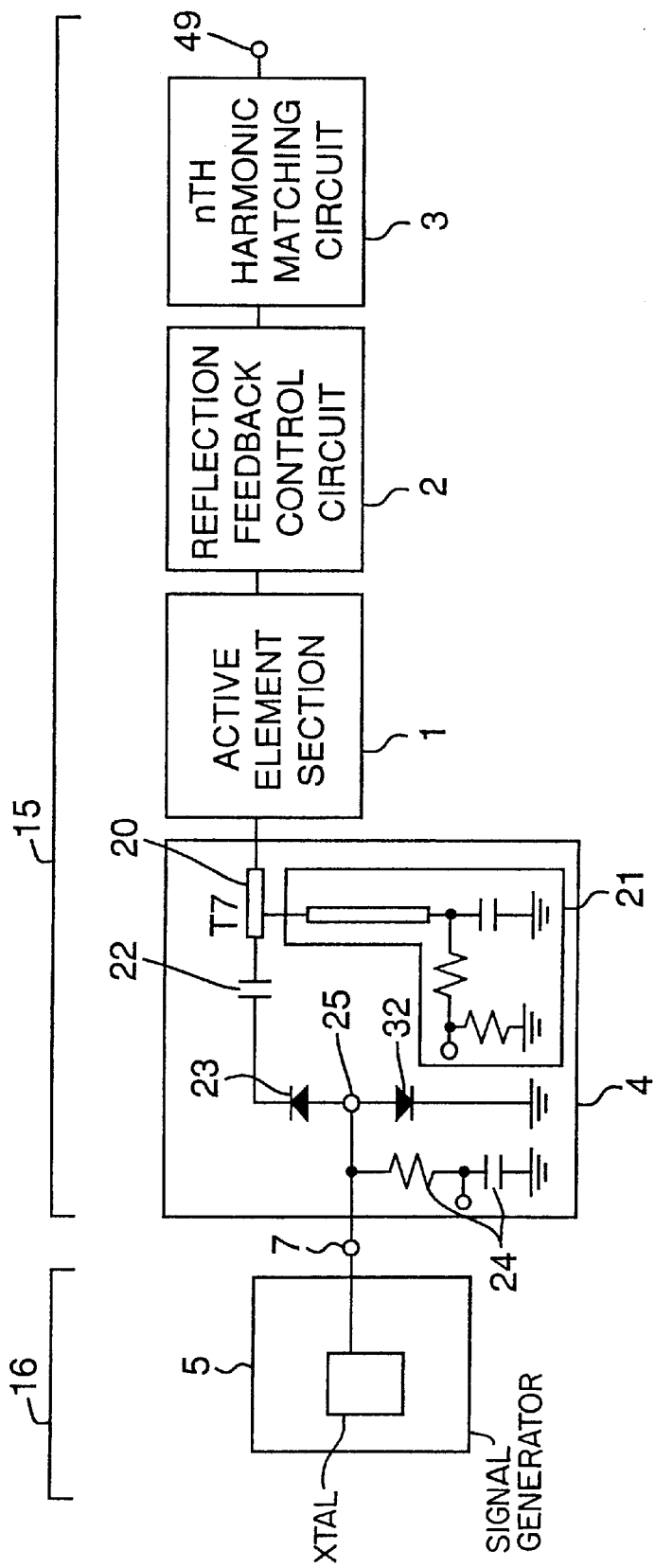
FIG. 3 shows an example of the circuit construction of a resonant circuit.

FIG. 3 shows a second example of the circuit construction. Parts in FIG. 3 same as those in FIG. 2 are designated by the same reference numerals as those of FIG. 2. The principle of the operation of the second example is similar to that of the first example shown in FIG. 2. Thus, only differences from the first example will be described below. In the first example, the signal input terminal 7 is provided at an end of the transmission line T7 or at an end of either of the (variable) capacitance elements 23 and 32, and the injection circuit 16 injects the signal having the frequency component f/m (m: an integer) into the resonant circuit 4 through the signal input terminal 7. In the second example, the signal input terminal 7 through which a signal having the frequency component f/m (m: integer) is injected is provided on a terminal 25 of the variable capacitance elements 23 and 32. More specifically, the two varactor diodes 23 and 32 are connected in series and in reverse orientations to serve as the variable capacitance element, and a signal having the frequency component f/m (m: integer) is injected into the intermediate point 25 between the two varactor diodes 23 and 32. By adopting such an arrangement, it is possible to stabilize the injection locking characteristic at the time of voltage application to the varactor diodes 23 and 32. That is, in the voltage application to the varactor diodes 23 and 32, DC voltages are offset each other at the injection signal input point 25. Thus, even though the free oscillation frequency is varied by changing the varactor voltage, there is no influence of the injection signal on the offset voltage of the diode voltage and thus no fluctuation in the amplitude of an oscillation wave, and a stable injection locking operation can be accomplished.

SECOND EMBODIMENT

Figure 4:
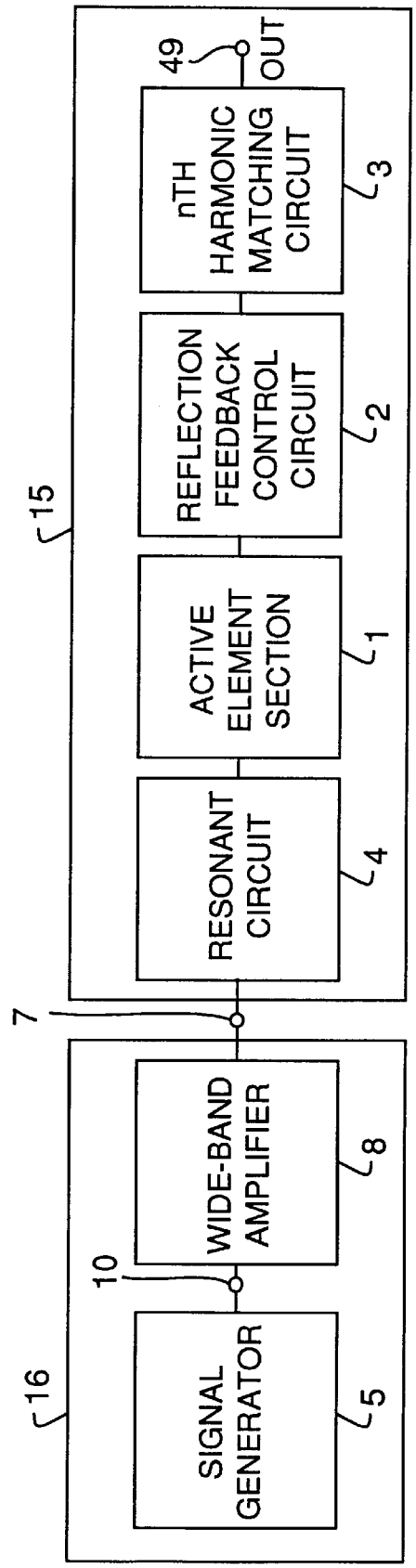
FIG. 4 shows an example of the fundamental construction of a second embodiment of the microwave/millimeter-wave injection locked oscillator of the present invention.

FIG. 4 shows the fundamental construction of the second embodiment of the present invention. Parts in FIG. 4 same as those in FIG. 1 are designated by the same reference numerals as those of FIG. 1. In the second embodiment, the oscillation circuit 15 is similar to the above-described one, and thus only the injection circuit 16 is described below. A wide-band non-linear amplifier 8 having an amplification degree or providing amplification in the frequency range between f/m and nf is connected with the signal input terminal 7 of the oscillation circuit 15. Further, the signal generator 5 is connected with an input side of the wide-band non-linear amplifier 8. By injecting a signal having a frequency f/(km) (k: integer) from an input terminal 10, the signal is non-linearly amplified and signal components f/(km), 2f/(km), 3f/(km), 4f/(km), 5f/(km) . . . are generated.

Owing to the frequency characteristic of the amplifier 8, the frequency components f/m–nf become conspicuous or outstanding, and the signals having such frequencies are inputted to the oscillation circuit 15 through the signal input terminal 7. The oscillation circuit 15 is locked to any one of input signals of the frequency components f/m–nf. The locking depends on the input signal power level of the frequency components f/m–nf and the non-linearity of the oscillation circuit 15. Owing to its non-linearity action, the oscillation circuit 15 has capability of being locked to subharmonics and harmonics of the signal having the free oscillation frequency of the oscillation circuit. Operation to be performed after the locking is similar to that of the circuit shown in FIG. 1. As described above, by providing the wide-band non-linear amplifier 8, it is possible to make the frequency of the injection locking signal lower than that of the case shown in FIG. 1 and thus utilize a phase locking oscillator having a crystal oscillator as used in, for example, the UHF digital radio communications, as the injection signal source.

A concrete example will be described below. For example, the wide-band non-linear amplifier 8 connected to the input portion 7 of the second embodiment has an amplification degree at frequencies 7.5 GHz–30 GHz. To the input terminal 10 is connected the signal generator 5 which generates a signal having a frequency f/12=1.25 GHz. By injecting a signal having a frequency 1.25 GHz into the amplifier 8, the signal is non-linearly amplified, and signals having outstanding frequency components of 7.5 GHz, 8.75 GHz, 10 GHz, 11.25 GHz, 12.5 GHz, 13.75 GHz, 15.0 GHz, . . . , and 30 GHz are inputted to the oscillation circuit 15 through the input terminal 7. The free oscillation frequency f' of the oscillation circuit 15 or nth harmonic component n×f' thereof is locked to any one of the frequency components 7.5 GHz (k=6), 15 GHz (k=12), and 30 GHz (k=24). Thus, in the second embodiment, it is possible to use a phase locking oscillator having a crystal oscillator generating a signal having a low frequency, for example, 1.25 GHz.

Further, provision of the amplifier 8 secures the electrical isolation of the oscillation circuit 15 and the injection circuit 16 from each other, with respect to the direction from the oscillation circuit 15 to the injection circuit 16, at high frequencies. Thus, a stable operation of the circuit is accomplished. Further, there is an advantage that due to the non-linear amplification by the amplifier 8, unnecessary wave components generated in the amplifier 8 are suppressed in the operation process of the injection locking and thus, hardly outputted to the output portion 49. Therefore, this disposition is useful.

The frequency variable width can be increased to (k×m× n)-fold width because owing to the non-linearity of the active element section 1 and that of the amplifier 8, the locking range at the injection locking time is multiplied by k×m×n when the oscillation frequency of the nth harmonic is viewed from the frequency of the injection signal. In addition, it is possible to widen the variable range of the frequency greatly by controlling the free oscillation frequency electrically by the variable capacitance element as well as controlling the injection locking at the same time. In the second embodiment, the non-linearity of the amplifier 8 and the amplification degree thereof are utilized. But even by using the nonlinearity of the multiplier and the conversion gain thereof, similar effects can be obtained. In addition, as described with reference to FIGS. 2 and 3, it is possible to widen the variable range of the frequency greatly by simultaneously controlling the free oscillation frequency electrically and the injection locking by means of the variable capacitance elements 22 and 32.

For example, owing to the characteristic non-linearity of the oscillation circuit 15 and the characteristic non-linearity of the wide-band non-linear amplifier 8, the frequency variable width is increased to be 48 times as large because the locking range at the injection locking time is multiplied by 48 (k=6, m=2, n=4; k=12, m=1, n=4; or k=24, m=1, n=2) when the signal of 60 GHz is viewed from the injection signal having the frequency 1.25 GHz.

THIRD EMBODIMENT

Figure 5:
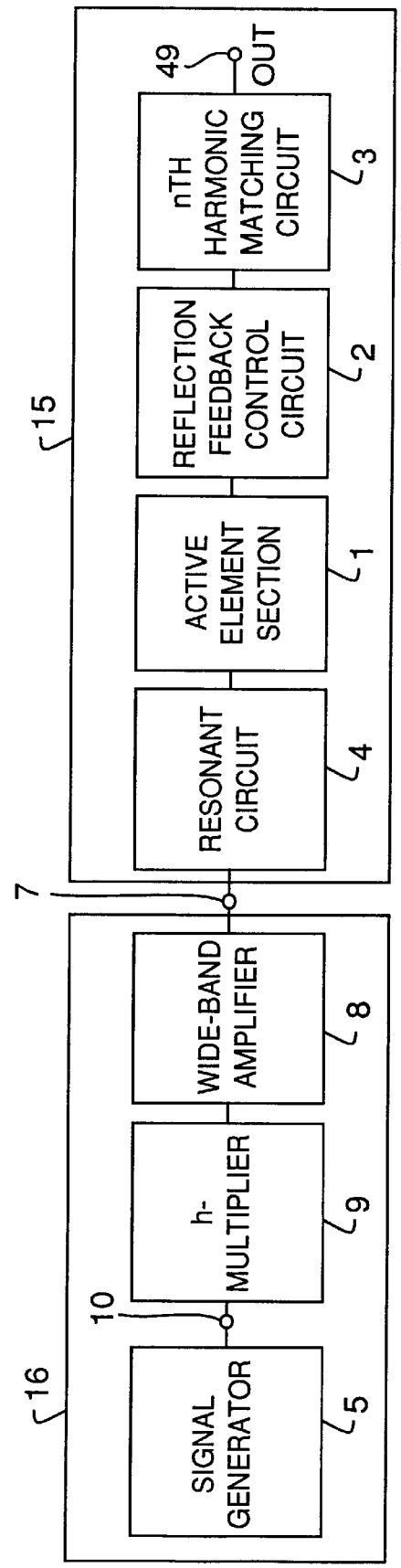
FIG. 5 shows an example of the fundamental construction of a third embodiment of the microwave/millimeter-wave injection locked oscillator of the present invention.

FIG. 5 shows the fundamental construction of the third embodiment. Parts in FIG. 5 same as those in FIG. 1 are designated by the same reference numerals as those of FIG. 1. Thus, only different parts will be described below.

The wide-band non-linear amplifier 8 having an amplification degree, or providing amplification, between a frequency f/m and a frequency nf is connected with the input terminal 7 of the oscillation circuit 15. Further, an h-multiplier (h: an integer) 9 is connected with an input side of the wide-band non-linear amplifier 8. The signal generator 5 generating a frequency f/(hmk) (h: integer) is connected with the input terminal 10 of the multiplier 9. By injecting a signal having the frequency component f/(hmk) into the input terminal 10, the frequency component f/(hmk) is multiplied by h by the multiplier 9 and then non-linearly amplified by the wide-band non-linear amplifier 8, resulting in signals in which the frequency components f/m–nf stand out, and the signals are inputted to the oscillation circuit 15 through the signal input terminal 7. As a result, in the oscillation circuit 15, the signal having the free fundamental oscillation frequency f' or a harmonic having a frequency n×f' is pulled in a signal of any one of the frequency components f/m–nf and is locked thereto (the cycle then depends on the power level of the input signal having a frequency component in the range of f/m–nf and the non-linearity of the oscillation circuit 15, as in the FIG. 4 embodiment). The operation to be performed after the locking is similar to that of the embodiment shown in FIG. 1.

In the circuit construction, by using the h-multiplier 9, it is possible to obtain signals of which h-multiplied frequency waves are predominant, and thus suppress a signal spectrum other than the h-multiplied frequency waves. Owing to the non-linear amplification operation of the amplifier 8, unnecessary wave components generated by the amplifier 8 are suppressed in the operation process of the injection locking to be hardly outputted to the output portion 49. If the amplifier 8 is constructed of a transistor circuit as is often the case, and/or if in particular the multiplier 9 is constructed of a transistor circuit, in the direction from the oscillation circuit 15 to the injection circuit 16, it is possible to secure the electrical isolation of the oscillation circuit 15 and the injection circuit 16 from each other, in the direction from the oscillation circuit 15 to the injection circuit 16, at high frequencies. Thus, a stable operation of the circuit can be accomplished. With such an arrangement, from the output portion 49 of the oscillation circuit 15, a signal of a fundamental wave of f×n (=60 GHz) is outputted.

As described above, by providing the multiplier 9 and the non-linear amplifier 8, it is possible to make the frequency of the injection locking signal lower than that of the case shown in FIG. 1. Thus, it is possible to utilize, as the injection signal source, a direct digital synthesizer or a phase locking oscillator having a high degree of stability and a low phase noise characteristic as used in, for example, the UHF or VHF digital radio communications.

Owing to the non-linearity of the active element section 1 and the amplifier 8, and the characteristic of the multiplier 9, a (h×k×m×n)-fold frequency variable width is obtained because owing to the non-linearity of the active element section 1 and of the amplifier 8, the locking range at the injection locking time is multiplied by h×k×m×n when the nth harmonic is viewed from the frequency of the injection signal. In addition, the variable range of the frequency is considerably widened through the electrical control of the free oscillation frequency and the simultaneous control of the injection locking by the variable capacitance element.

A concrete example will be given below. The input portion 7 of the oscillation circuit 15 is connected with the wide-band non-linear amplifier 8 having an amplification degree at frequencies 15 GHz–30 GHz. Further, a 4-multiplier 9 (h=4) is connected with an input side of the amplifier 8. The signal generator 5 generating a signal having a frequency f/48=312.5 MHz is connected with the input terminal 10 of the multiplier 9. By injecting a signal having a frequency component 312.5 MHz into the 4-multiplier 9, the frequency is multiplied by four by the 4-multiplier 9 and the four-fold wave is non-linearly amplified, and signals having frequencies 7.5 GHz, 8.75 GHz, 10 GHz, 11.25 GHz, 12.5 GHz, 13.75 GHz, 15.0 GHz, . . . , and 30 GHz which are conspicuous are inputted to the oscillation circuit 15 through the input terminal 7. In the oscillation circuit 15, a signal having the fundamental oscillation frequency f' or the nth harmonic thereof having a frequency n×f' is locked to a signal of any one of frequency components 7.5 GHz (h=4, k=6), 15 GHz (h=4, k=12), and 30 GHz (h=4, k=24).

As described above, in the third embodiment, it is possible to connect the input terminal 10 of the 4-multiplier 9 with the signal generator 5 capable of switching frequencies at a high speed which can be implemented by, for example, a direct digital synthesizer having a frequency 312.5 MHz. Owing to the non-linearity of the oscillation circuit 15, the non-linearity of the amplifier 8, and the characteristic of the multiplier 9, the frequency variable width can be increased to be 192 times as large because the locking range at the injection locking time is multiplied by 192 (h=4, k=6, m=2, n=4; h=4, k=12, m=1, n=4; or h=4, k=24, m=1, n=2), when the output signal frequency of 60 GHz is viewed from the frequency of the injection signal. In addition, it is possible to widen the variable range of the frequency greatly by controlling the free oscillation frequency electrically by the variable capacitance element while the injection locking is being controlled at the same time.

Figure 6:
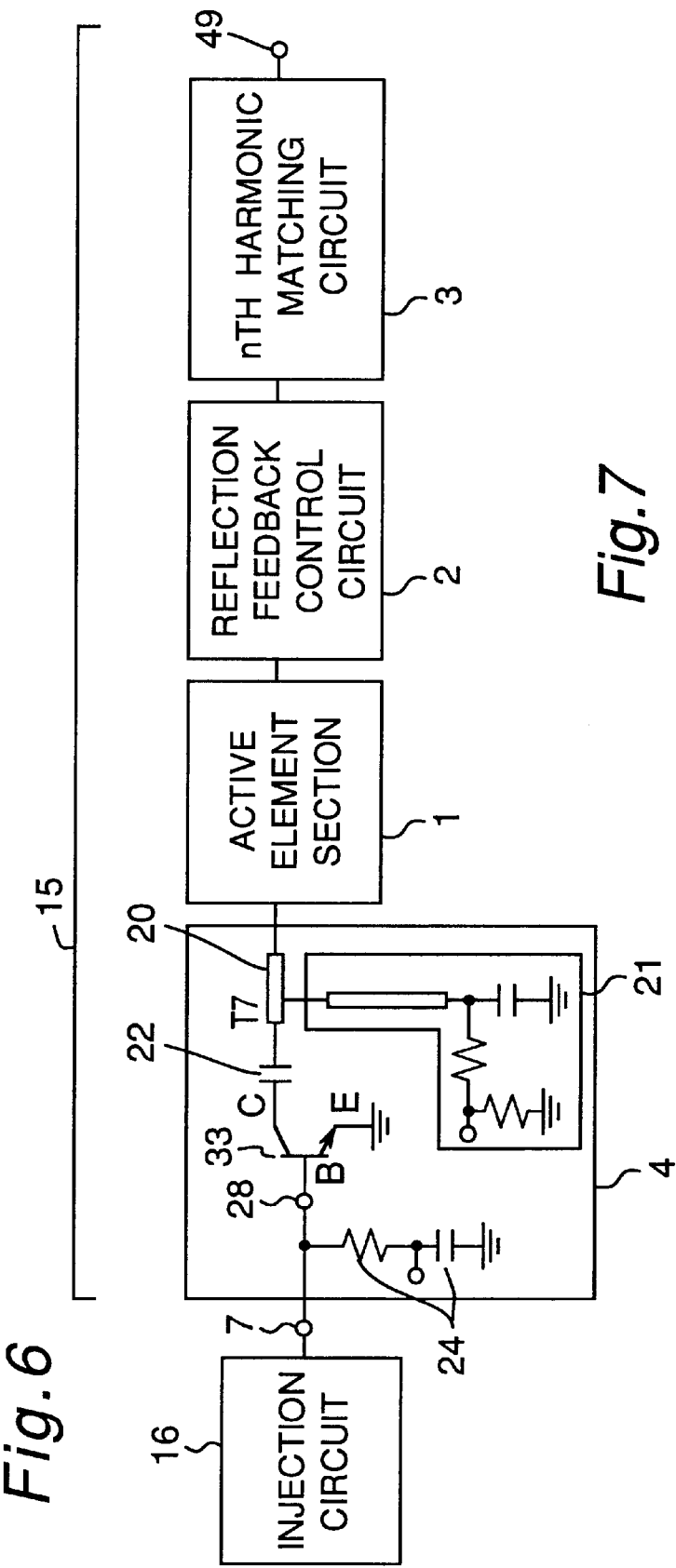
FIG. 6 shows another example of the circuit construction of the resonant circuit.
Figure 7:
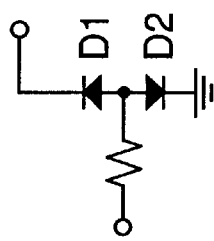
FIG. 7 shows an equivalent circuit when a transistor is used as a varactor.

FIG. 6 shows another example of the construction of the resonant circuit 4. The difference of the example shown in FIG. 6 from the examples shown in FIGS. 2 and 3 resides in that in the example shown in FIG. 6, a microwave transistor 33, which is a three-terminal element, is used as a variable capacitance. By using the three-terminal element, it is possible to connect a collector terminal C with a capacitance 22 for DC cut-off at the resonant circuit side, ground an emitter E, and use a base terminal B as an injection signal terminal. A model of an equivalent circuit of the transistor 33 is shown in FIG. 7. As apparent from FIG. 7, twin varactor diodes D1 and D2 are connected with each other in series and in opposite orientations, similarly to FIG. 2.

As a method of connecting the terminals of the microwave transistor 33, it is also possible to connect the base terminal B with the resonant circuit side DC cut-off capacity 22, ground the emitter E, and use the collector terminal C as the injection signal terminal. In this case, too, it is possible to obtain the variable frequency characteristic of the free oscillation frequency and obtain the injection-locked characteristic. Further, as still another connection method, it is possible to connect the emitter E with the DC cut-off capacity 22 at the resonant circuit side, ground the base terminal B, and use the collector terminal C as the injection signal terminal. In this case, too, it is possible to obtain the variable frequency characteristic of the free oscillation frequency and obtain the injection locking characteristic.

Figure 8:
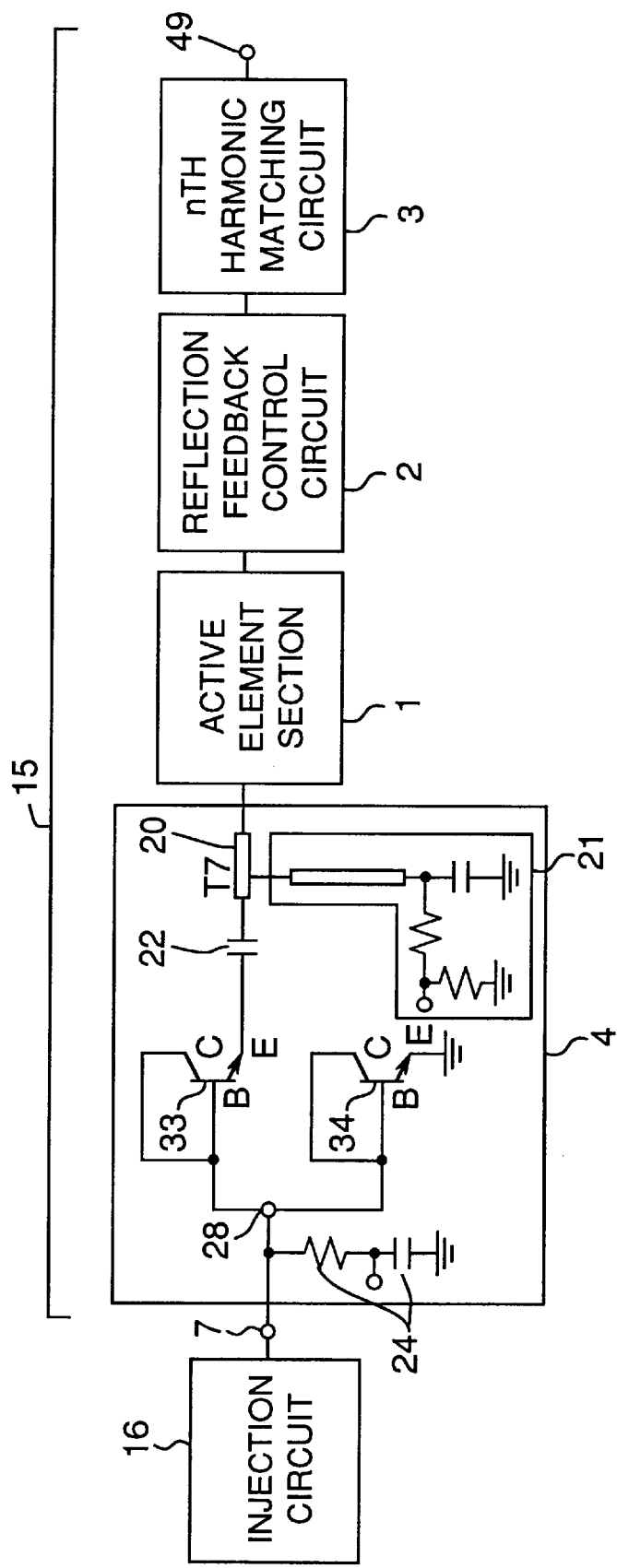
FIG. 8 shows still another example of the circuit construction of the resonant circuit.

FIG. 8 shows still another example of the construction of the resonant circuit 4. Parts in FIG. 8 same as those in FIGS. 2, 3, and 6 are designated by the same reference numerals as those of FIGS. 2, 3, and 6. In the example of FIG. 6, one transistor 33 is used to constitute the variable capacitance element. In the example of FIG. 8, two transistors 33 and 34 are used to constitute the variable capacitance element. That is, an emitter terminal E of one transistor 33 is connected with the resonant circuit side DC cut-off capacitance 22, and an emitter terminal E of the other transistor 34 is grounded. A base terminal B of the transistor 33 and a base terminal B of the transistor 34 are connected with each other at a node 28. Also, a collector terminal C of the transistor 33 and a collector terminal C of the transistor 34 are connected with each other at a node 28. The node 28 is further connected with a transistor bias circuit 24 and with the injection circuit 16.

Even the use of one transistor in the embodiment shown in FIG. 6 allows the twin diode as shown in FIG. 7 to be constructed. However, performance of the base-collector diode D1 of the transistor 33 is different from performance of the base-emitter diode D2. Thus, it is difficult to offset characteristics of applied diode voltages each other even though the diodes are located in reverse orientations. Further, the offset voltage of the diode voltage is affected by the injection signal.

In contrast, in the embodiment shown in FIG. 8, the base-emitter diodes D2 having equivalent diode characteristics are arranged in series and in reverse orientations to achieve an equivalent circuit similar to that of FIG. 2. In this embodiment, the base and collector terminals B, C are connected with each other to allow them to have the same electric potential. Alternatively, the collector terminals C and C may be open. Even in such a construction, it is possible to obtain the variable frequency characteristic of the free oscillation frequency and the injection locking characteristic. Further, each collector terminal C may be connected with a resistance element. Even in such a construction, it is possible to obtain the variable frequency characteristic of the free oscillation frequency and the injection locking characteristic. Further, the collector terminals C may be directly grounded. Even in such a construction, it is possible to obtain the variable frequency characteristic of the free oscillation frequency and the injection locking characteristic.

In the injection locked oscillators shown in FIGS. 1 through 8, at a frequency in a point in the locking range (namely, the frequency range of the injection signal), the signal of an nth harmonic to be outputted to the output terminal 49 is locked in phase to the injection signal received through the signal input terminal 7.

However, when the injection signal outputted from the signal generator 5 is constant between a frequency (minimum frequency) corresponding to the start point of the locking range and a frequency (maximum frequency) corresponding to the termination point thereof, there is a case that the phase of the output signal of the nth harmonic differs by n×(±90°) between a signal having the minimum frequency of the locking range and a signal having the maximum frequency thereof, i.e., the phase is not constant in the locking range.

In this case, it is difficult to use the injection locked oscillator as the signal source for a synchronous detection of a receiver. Further, there are problems such as fluctuation in the output signal of the nth harmonic, fluctuation in the phase noise, and increase of an undesired spurious signal. Embodiments which are described below solve such disadvantages.

FOURTH EMBODIMENT

Figure 9:
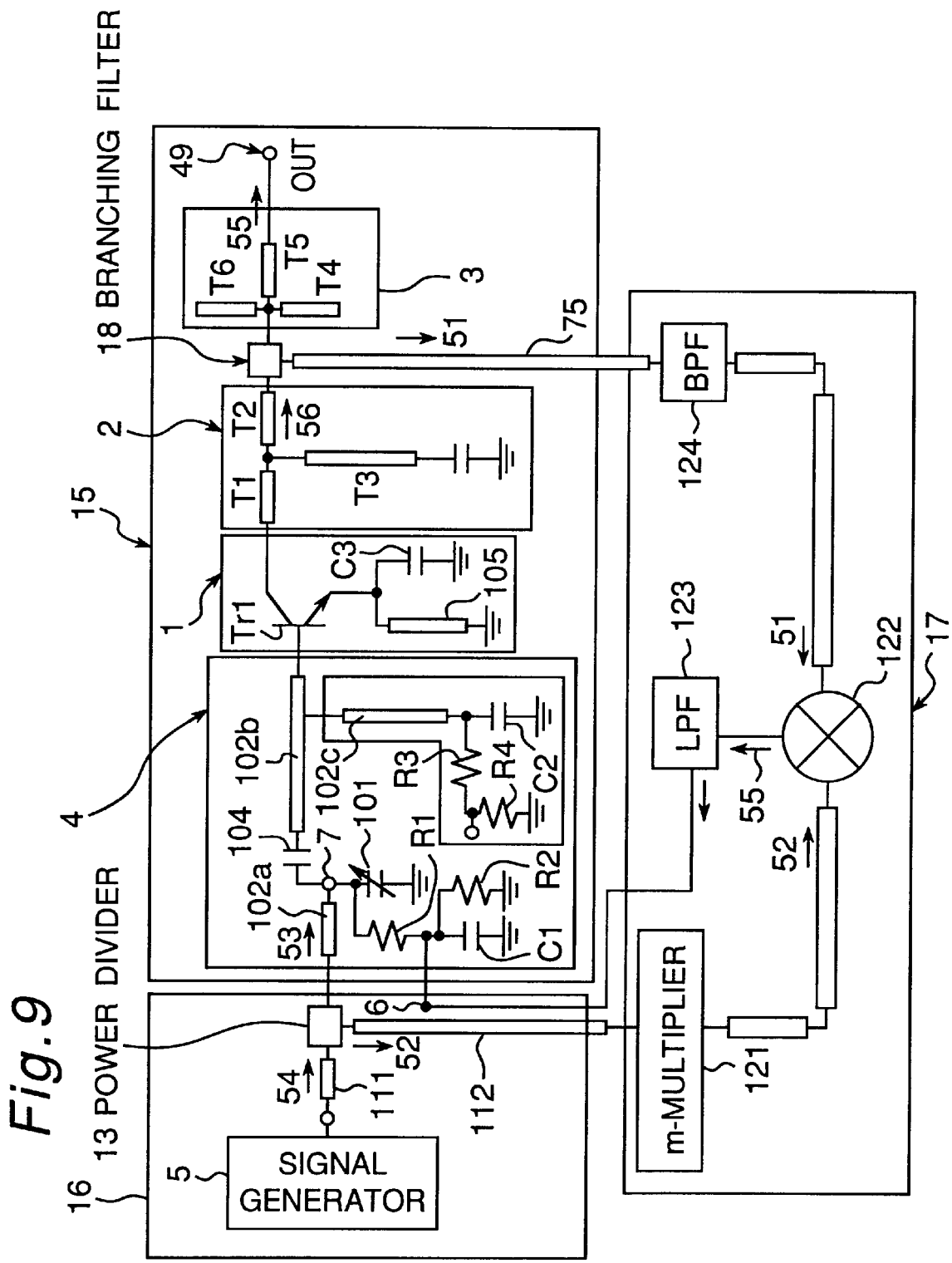
FIG. 9 shows an example of the fundamental construction of a fourth embodiment of the microwave/millimeter-wave injection locked oscillator of the present invention.

FIG. 9 shows the fundamental construction of a fourth embodiment of the microwave/millimeter-wave injection locked oscillator of the present invention. Parts in FIG. 9 same as those in FIGS. 1 through 8 are designated by the same reference numerals as those of FIGS. 1 through 8. The oscillator of the fourth embodiment is constructed essentially of an oscillation circuit 15, an injection circuit 16, and a frequency negative feedback loop section 17.

The oscillation circuit 15 has a frequency variable resonant circuit 4, an active element section 1, a reflection feedback control circuit 2, a branching filter 18, and an nth harmonic matching circuit 3.

The frequency variable resonant circuit 4 has a variable capacitance element 101 composed of a varactor diode and transmission lines 102a, 102b, and 102c.

The transmission line 102a is connected with a signal input terminal 7. The signal input terminal 7 is connected with a capacitance element 104 and the variable capacitance element 101. The variable capacitance element 101 is grounded. A point of connection between the variable capacitance element 101 and the input terminal 7 is connected with a series circuit made up of a resistor R1 and a capacitance element C1. The series circuit is grounded. A resistor R2 is connected with a point of connection between the resistor R1 and the capacitance element C1. The resistor R2 is grounded. A voltage control terminal 6 is connected to a point of connection between the resistor R1 and the capacitance element C1.

The capacitance element 104 is connected with the transmission line 102b. The transmission line 102c is connected with the transmission line 102b. The capacitance element C2 is connected with the transmission line 102c. The capacitance element C2 is grounded. Resistors R3 and R4 are connected in series with the transmission line 102c. A resistor R4 is grounded.

The resonant circuit 4 resonates at a control frequency f.

The active element section 1 comprises a microwave transistor Tr1 having a reflection feedback gain at the oscillation control frequency f.

The base of the microwave transistor Tr1 is connected with the transmission line 102b. The collector of the transistor Tr1 is connected in parallel with the capacitance element C3 and the transmission line 105. The capacitance element C3 and the transmission line 105 are grounded. The active element section 1 is connected between the resonant circuit 4 and the reflection feedback control circuit 2.

The reflection feedback control circuit 2 has a transmission line T1 connected with the emitter of the transistor Tr1. A transmission line T2 is connected with the transmission line T1. To a point of connection between the transmission line T1 and the transmission line T2 is connected a series circuit made up of a transmission line T3 and a capacitance element C5. This series circuit is grounded. The transmission line T2 is connected with a branching filter 18. The reflection feedback control circuit 2 controls the reflection feedback gain of the oscillation control frequency f.

The nth harmonic matching circuit 3 has a transmission line T5 connected with the branching filter 18. A transmission line T4 and a transmission line T6 are connected with a point of connection between the transmission line T5 and the branching filter 18. The transmission line T5 is connected with an output portion 49.

The nth harmonic matching circuit 3 takes out a signal having a harmonic component n×f (n: integer) from a signal obtained from the branching filter 18, and provides it to the output portion 49.

The injection circuit 16 has a signal generator 5. A power divider or distributor 13 is connected with the signal generator 5 through a transmission line 111. One of output of the power divider 13 is connected with the resonant circuit 4, and the other output thereof is connected with a frequency negative feedback loop section 17 through a transmission line 112.

The signal generator 5 is constituted of a phase locking oscillator having high signal purity, and includes a crystal oscillator. The injection circuit 16 injects a signal 54 having a frequency component of a frequency fo (fo=f/m (m: integer) from the power divider 13 to the resonant circuit 4.

That is, the signal 54 transmitted from the signal generator 5 is divided into two signals by the power divider 13. One signal 53 is injected into the transmission line 102a of the resonant circuit 4. The other signal 52 is inputted to the frequency negative feedback loop section 17 in which it is inputted to a frequency mixer 122 through an m-multiplier 121.

The frequency negative feedback loop section 17 has the m-multiplier 121, the frequency mixer 122, a band-pass filter 124, and a low-pass filter 123.

The m-multiplier 121 is connected with the other output of the power divider 13 in the injection circuit 16. The m-multiplier 121 is also connected with one of input terminals of the frequency mixer 122 through a transmission line. The output terminal of the frequency mixer 122 is connected with the variable capacitance voltage control terminal 6 of the resonant circuit 4 through the low-pass filter 123. The band-pass filter 124 is connected with the other input terminal of the frequency mixer 122 through a high frequency transmission line 75 which is a distributed constant line. The band-pass filter 124 is also connected with the branching filter 18.

In the frequency negative feedback loop section 17, a fundamental wave oscillation signal 51 taken out by the branching filter 18 connected with the output side of the reflection feedback control circuit 2 of the oscillation circuit 15 is inputted to the frequency mixer 122 through the band-pass filter 24. Further, one 52 of the two signals obtained by division by the power divider 13 of the injection circuit 16 is multiplied by m by the multiplier 21 and inputted to the frequency mixer 122. The frequency mixer 122 compares the frequency of the signal 51 and the frequency of the signal 52.

The frequency mixer 122 supplies an output signal 55 to the low-pass filter 123. The output signal 55 is fed back to the variable capacitance voltage control terminal 6 of the oscillation circuit 15 from the low-pass filter 123.

The operation of the injection locked oscillator having the above construction is described below.

In this embodiment, the signal 53 derived from the signal generator (a reference signal source) 5 and subjected to division by the power divider 13 is injected into one end of the transmission line 102a of the resonant circuit 4. Then, owing to the non-linearity of the oscillation circuit 15, an mth harmonic having a frequency fo of the signal generator 5 is generated inside the oscillation circuit 15. Then, the signal of the oscillation circuit 15 is locked in frequency and phase to the mth harmonic. The locking speed is 100–1000 times as high as the locking speed of the frequency negative feedback loop section 17, which will be described below.

Unlike the locking characteristic brought about by the frequency negative feedback loop section 17, the locking characteristic brought about by the injection signal does not depend on the low-pass filter 123 inside the frequency negative feedback loop section 17. Thus, noise can be reduced even in the outside of the band of the low-pass filter 123.

The operation of the frequency negative feedback loop section 17 is described below. The oscillation circuit 15 oscillates freely in the neighborhood f' of the control frequency f owing to the resonant circuit 4 resonating at the control frequency f and the reflection feedback gain characteristic of the active element section 1. The free oscillation frequency f' can be changed by varying the oscillation frequency f in the resonant circuit 4.

In this embodiment, the free oscillation signal having the frequency f' generated in the oscillation circuit 15 is taken out by the branching filter 18 to be supplied to the frequency negative feedback loop section 17. Then, signal components having frequencies other than frequencies in the neighborhood of f–f' are removed from the free oscillation signal by the band-pass filter 124 and the resulting signal is inputted to the frequency mixer 122.

The signal 54 outputted from the signal generator 5 is inputted, via the power divider 13, to the m-multiplier 121 and multiplied by m. The wave generated by the multiplication by m and outputted from the m-multiplier 121 is the signal 52 having a low noise and having a degree of stability equal to that of the crystal oscillator. The signal 52 and the signal 51 outputted from the branching filter 18 are inputted to the frequency mixer 122 and the frequencies thereof are compared with each other. The frequency mixer 122 generates an error signal 55 of the signals 51 and 52. Only the error signal 55 is taken out through the low-pass filter 123 and fed back to the variable capacitance voltage control terminal 6.

The oscillation frequency of the oscillation circuit 15 is varied by the voltage of the error signal 55. More specifically, the polarity of the variable capacitance voltage control terminal 6 and that of the error signal 55 are so set that a negative feedback occurs for the oscillation frequency of the oscillation circuit 15.

While such a feedback looping is being repeated in the frequency negative feedback loop section 17, the free oscillation frequency f' of the oscillation circuit 15 becomes a signal as stable and low in noise as the signal 52 having a frequency m times the frequency of the reference signal outputted from the signal generator 5, namely the mth harmonic of the reference signal.

As described above, in the present embodiment, operating the frequency negative feedback loop section 17 during the injection locking operation makes the free oscillation frequency approach a frequency m times the reference oscillation frequency. Accordingly, it is possible to restrict the oscillation frequencies of the oscillation circuit 15 to the frequency region in which the injection locking is performed.

Further, according to the embodiment, by controlling the frequency negative feedback voltage of the frequency negative feedback loop section 17, it is possible to vary the free oscillation frequency f' of the oscillation circuit 15 and allow the free oscillation frequency f' to follow the frequency of the injection signal. Accordingly, it is possible to accomplish the locking to the extent of the frequency voltage control range of the frequency variable resonant circuit 4 and widen the locking range. Thus, it is possible to solve the problem of the conventional injection locked oscillator that the locking range is narrow.

Further, according to this fourth embodiment, the operation of the frequency negative feedback loop section 17 solves the problem of the injection locked oscillator that there occurs a phase shift by about 180° between the start and termination points of the frequency range in which the injection locking is performed. Thus, it is possible to keep the phase constant at the start and termination points of the injection locking frequency range.

By such an operation, in the oscillation circuit 15, a signal whose phase and frequency are locked to the phase and the frequency of an m-multiplied wave (frequency: (f/m)×m) of the reference signal of the signal generator 5 becomes the fundamental oscillation wave.

Further, a harmonic of the oscillation frequency f is generated due to the non-linearity of the oscillation circuit 15, and a desired harmonic signal can be taken out by the nth harmonic matching circuit 3. The frequency of the signal outputted from the output portion 49 of the oscillation circuit 15 is nf (=n×m×fo). For example, by setting m to 3 (m=3) and n to 4 (n=4) and using the reference signal source 5 having a crystal oscillator of a frequency 5 GHz, it is possible to take out a stable and low-noise signal of a frequency 60 GHz from the output portion 49 of the oscillation circuit 15.

As described above, in the fourth embodiment, owing to the operation of the frequency locking and phase locking accomplished by the frequency negative feedback oscillator 17, the problems of the conventional injection locked oscillator are solved and the high-speed frequency locking and phase locking are enabled. Thus, a low phase noise microwave and millimeter wave frequency synthesizer can be accomplished.

Further, because in the fourth embodiment, parts other than the reference signal generator 5 are constituted of analog circuits, they can be allowed to be monolithic on a GaAs substrate.

In the above-described embodiment, the signal 53 outputted from the injection circuit 16 is injected into one end of the transmission line 102a, but alternatively, may be injected into either end of the capacitance element 104. Further, the signal 53 may be injected into either end of the transmission line 102a or 102b.

FIFTH EMBODIMENT

Figure 10:
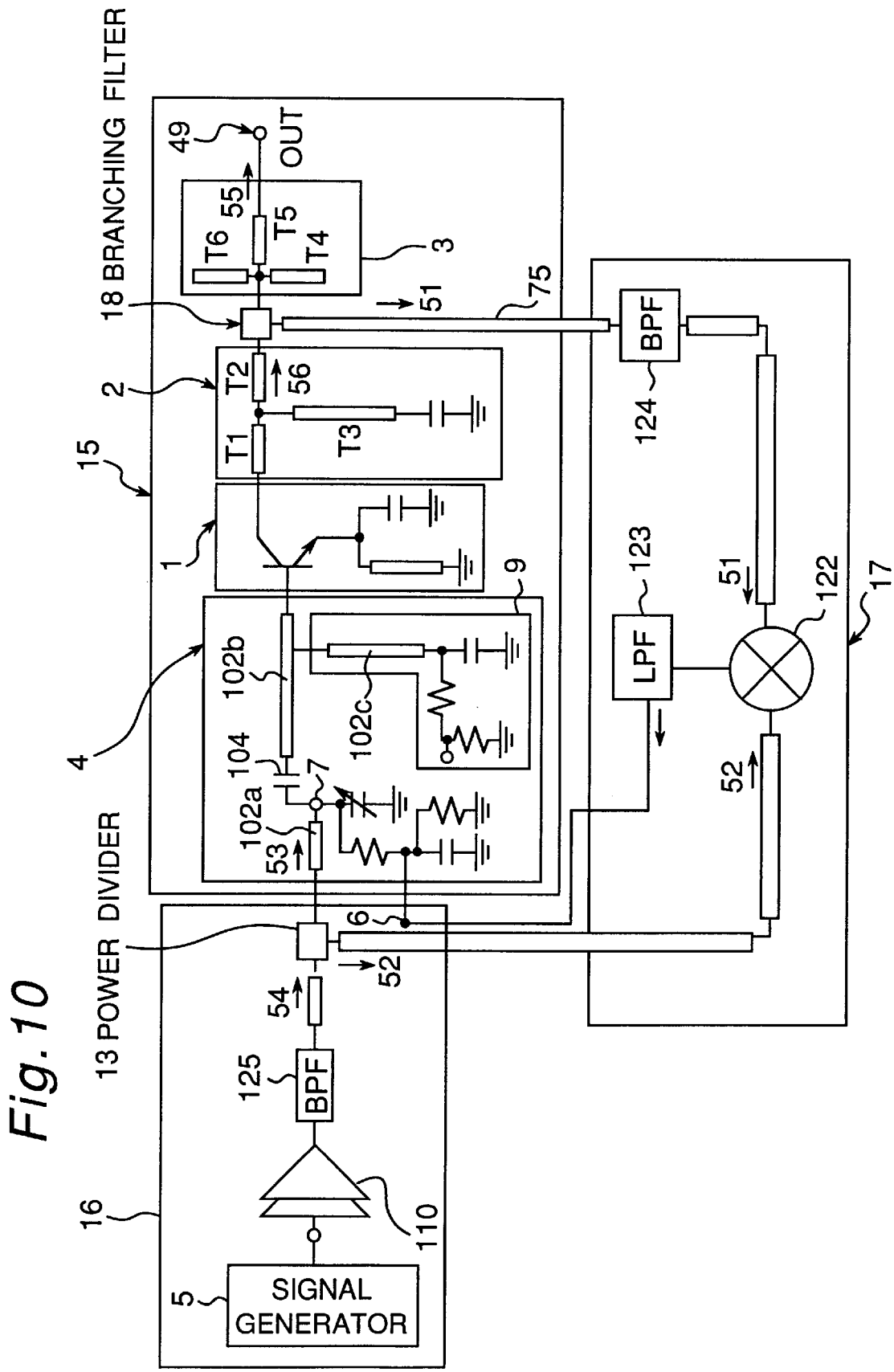
FIG. 10 shows the circuit construction of a fifth embodiment of the present invention.

FIG. 10 shows the construction of a fifth embodiment of the present invention. Similarly to the fourth embodiment, the microwave/millimeter-wave injection locked oscillator of the fifth embodiment has a frequency negative feedback loop. The operation principle of the fifth embodiment is similar to that of the fourth embodiment. Thus, parts in FIG. 10 same as or similar to those of FIG. 9 are designated by the same reference numerals as those of FIG. 9, and different parts are described mainly.

The fifth embodiment is different in two points from the fourth embodiment: The injection circuit 16 of the former has a high frequency amplifier 110 connected with the signal generator 5 at its output side and has a bandpass filter 125 connected with the high frequency amplifier 110; and the frequency negative feedback loop section 17 does not have the m-multiplier 121.

In the fifth embodiment, the harmonic amplifier 110 generates an hth (h: an integer) harmonic of a signal fo (fo=f/h) of the reference signal generator 5. The frequency f of the hth harmonic is (h×fo) which is around the free oscillation frequency f'. By injecting the hth harmonic having the frequency f from the injection circuit 16 into the oscillation circuit 15, the injection locking are performed in the oscillation circuit 15 by using the hth harmonic as the fundamental wave.

Further, by providing the high frequency amplifier 110, the signal 52 from the injection circuit 16 which has passed through the power divider 13 is directly inputted to the frequency mixer 122 without passing through any multiplier.

In the fifth embodiment, a harmonic is generated due to the non-linearity of the high frequency amplifier 110, the harmonic component signal (f=h×fo) is taken out by the band-pass filter 125, the signal component 54 is divided into two signals by the power divider 13, and one 53 of the two signals is injected into one end of the transmission line 102a of the resonant circuit 4. Because the frequency of the other signal 52 has already become the fundamental oscillation control frequency f, the signal 52 is inputted as it is to the frequency mixer 122.

The frequency of the signal 55 outputted from the output portion 49 of the oscillation circuit 15 is nf (=n×h×fo). Other operations of the fifth embodiment are similar to those of the fourth embodiment.

According to the fifth embodiment, because the harmonic amplifier 110 generates the harmonic outside the oscillation circuit 15, it is possible to increase the output efficiency of generation of the harmonic. Accordingly, it is possible to lower the operation frequency of the signal generator 5 serving as the reference signal source.

Further, in the fifth embodiment, because the signal of the fundamental oscillation frequency components is injected to the oscillation circuit 15 from the injection circuit 16, the injection locking range can be widened, and a stable injection locking characteristic can be obtained. This, together with the frequency/phase locking characteristics improved by the reference negative feedback loop 17, allows a further stable operation characteristic to be obtained.

For example, by setting h to 10 (h=10) and n to 4 (n=4) and using the signal generator 5 having a crystal oscillator of a frequency 1.5 GHz, it is possible to take out a stable and low phase noise signal having a frequency 60 GHz from the output portion 49 of the oscillation circuit 15.

As the signal generator 5 of 1.5 GHz, it is possible to use a phase locking oscillator (PLO) having a crystal oscillator and being used in mobile communications in recent years. According to the fifth embodiment, it is possible to obtain a signal having a frequency 60 GHz with frequency stability as high as that of the phase locking oscillator. Further, the present embodiment offers a compact and inexpensive device.

In this embodiment, the signal 53 outputted from the injection circuit 16 is injected into one end of the transmission line 102a, but alternatively may be injected into an end of the capacitance element 104. Further, the signal 53 may be injected into an end of the transmission line 102a or 102b.

SIXTH EMBODIMENT

Figure 11:
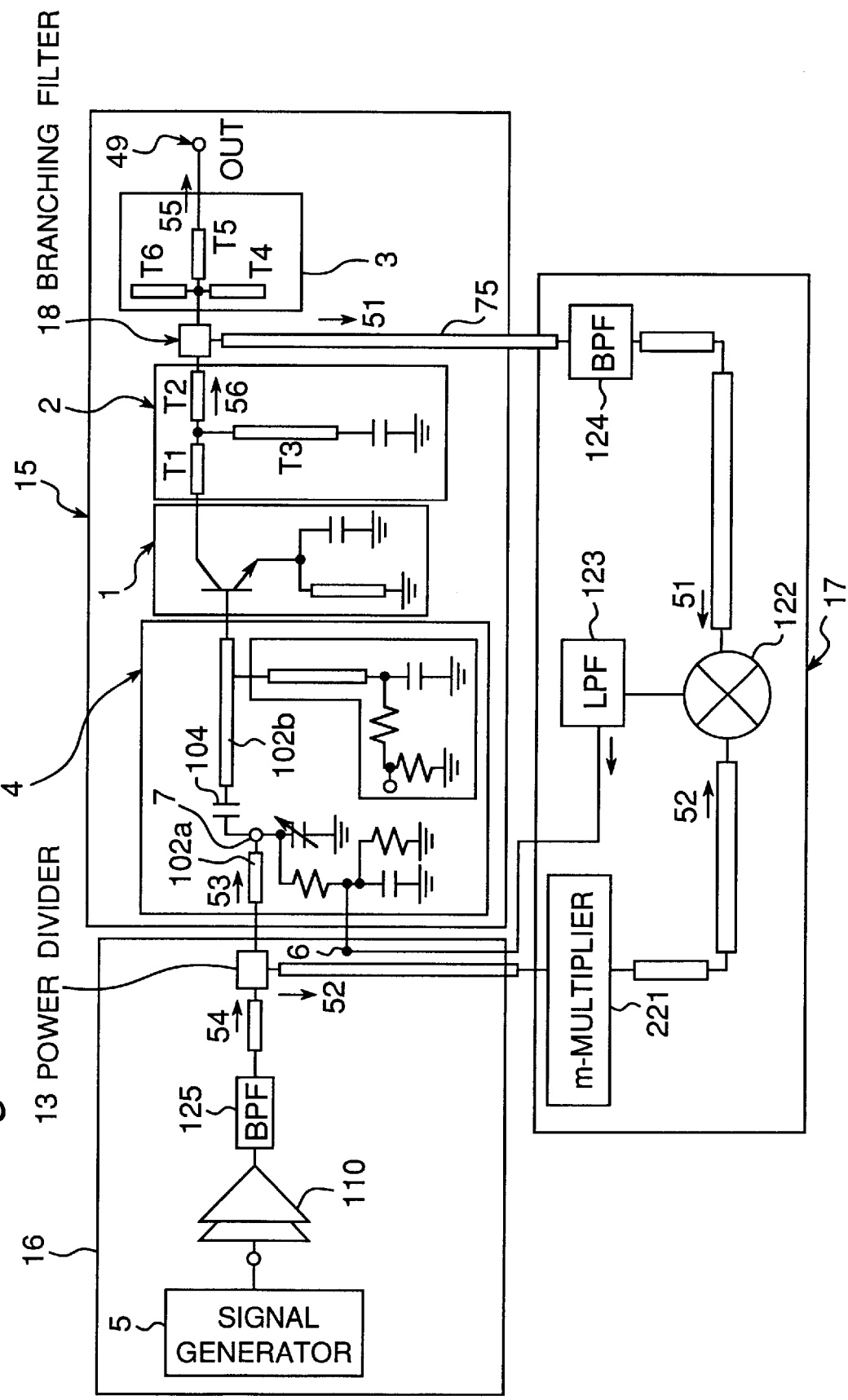
FIG. 11 shows the circuit construction of a sixth embodiment of the present invention.

FIG. 11 shows the construction of a sixth embodiment of the present invention. Similarly to the fifth embodiment, the microwave/millimeter-wave injection locked oscillator of the sixth embodiment has a frequency negative feedback loop. Thus, parts in FIG. 11 same as or similar to those in FIG. 10 are designated by the same reference numerals as those of FIG. 10, and different parts are described mainly.

The sixth embodiment is different from the fifth embodiment only in that the frequency negative feedback loop section 17 has an m-multiplier 221 (m: an integer). In other words, the sixth embodiment is a combination of the fourth and fifth embodiments.

In the sixth embodiment, the harmonic amplifier 110 generates an hth harmonic of a signal of a frequency fo (fo=f/mh) outputted from the signal generator 5, by its non-linearity. The frequency of the hth harmonic is fo×h which is 1/m of the fundamental oscillation control frequency f, namely, f/m.

The band-pass filter 125 takes out only the signal components 54 whose frequencies are in the neighborhood of 1/m of the fundamental oscillation frequency f, and the power divider 13 divides the signal components 54 to two signals. One signal 53 of the two signals is injected into one end of the transmission line 102a of the resonant circuit 4. Upon receipt of the signal 53, the oscillation circuit 15 generates harmonics of the reference signal by the non-linearity inside the oscillation circuit 15.

The m-multiplier 221 multiplies the frequency of the other signal 52 by m. The resulting signal is inputted to the frequency mixer 122 as a signal component of the fundamental oscillation control frequency f (f=fo×h×m). Other operations of the sixth embodiment are similar to the fourth and fifth embodiments.

The frequency of the signal outputted from the output portion 49 of the oscillation circuit 15 is nf (=n×h×m×fo).

As described above, in the sixth embodiment, by providing the combined construction of the fourth and fifth embodiments, it is possible to further increase the frequency of the signal outputted from the output portion 49 of the oscillation circuit 15.

For example, let it be supposed that the free fundamental oscillation frequency of the oscillation circuit 15 is 30 GHz and that the signal generator 5 of 1.5 GHz having a crystal oscillator is used. In this case, by setting h to 10 (h=10), n to 4 (n=4), and m to 2 (m=2), it is possible to take out a stable signal of a frequency 120 GHz with a low phase noise from the output portion 49 of the oscillation circuit 15.

In the above-described embodiment, the signal 53 outputted from the injection circuit 16 is injected into one end of the transmission line 102a, but alternatively may be injected into an end of the capacitance element 104. Further, alternatively, the signal 53 may be injected into an end of the transmission line 102a or 102b.

SEVENTH EMBODIMENT

Figure 12:
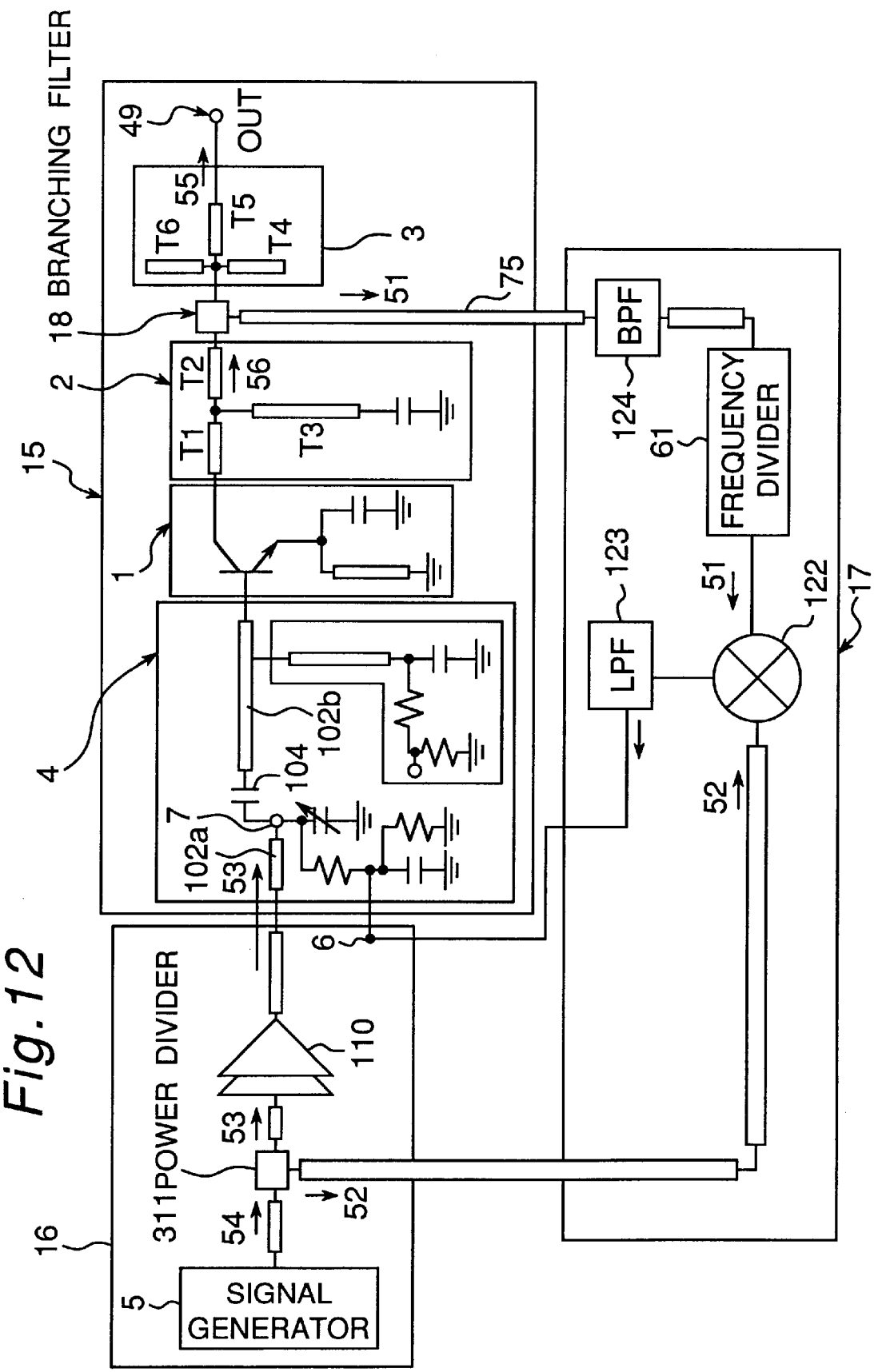
FIG. 12 shows the circuit construction of a seventh embodiment of the present invention.

FIG. 12 shows the construction of a seventh embodiment of the present invention. Similarly to the fifth embodiment, the microwave/millimeter-wave injection locked oscillator of the seventh embodiment has a frequency negative feedback loop. The operational principle of the seventh embodiment is similar to that of the fifth embodiment. Thus, parts in FIG. 12 same as or similar to those in FIG. 10 are designated by the same reference numerals as those of FIG. 10, and different parts are described mainly.

The seventh embodiment is different from the fifth embodiment in that the injection circuit 16 of the former has a power divider or distributor 311 connected between the signal generator 5 and the harmonic amplifier 110 and does not have the band-pass filter 125 and that the frequency negative feedback loop section 17 has a frequency divider 61 connected between the frequency mixer 122 and the band-pass filter 124.

In the seventh embodiment, as shown in FIG. 12, an output signal 51 of the branching filter 18 is frequency-divided by the frequency divider 61 to lower the operation frequency and then inputted to the frequency mixer 122. A signal from the signal generator 5 is directly divided into two signals by the power divider 311 without being subjected to a multiplying operation, and one signal 52 is inputted to the frequency mixer 122.

The other 53 of the two divided signals is supplied to the harmonic amplifier 110 to generate harmonic components in the signal generator 5. The frequency f of the harmonic component is fo×h. The harmonic component is injected into one end of the transmission line 102a of the resonant circuit 4. The frequency of the signal outputted from the output portion 49 of the oscillation circuit 15 is nf (=n×h×fo).

According to the seventh embodiment, it is possible to reduce the operation frequency of the frequency mixer 122 and manufacture the frequency negative feedback loop section 17 very simply and inexpensively.

For example, by setting the free fundamental oscillation frequency of the oscillation circuit 15 to 16 GHz, h to 8, and n to 4 and using the reference signal source 5 generating a signal of 2 GHz and having a crystal oscillator, it is possible to output a signal having a frequency 64 GHz from the output portion 49 of the oscillation circuit 15. In this example, the operation frequency of the frequency mixer 122 is as low as 2 GHz.

The frequency divider 61 is used in the seventh embodiment. But it is possible to use a frequency mixer instead of the frequency divider 61.

In the above-described embodiment, the signal 53 outputted from the injection circuit 16 is injected into one end of the transmission line 102a, but alternatively may be injected into either end of the capacitance element 104. Further, the signal 53 may be injected into an end of the transmission line 102a or 102b.

EIGHTH EMBODIMENT

Figure 13:
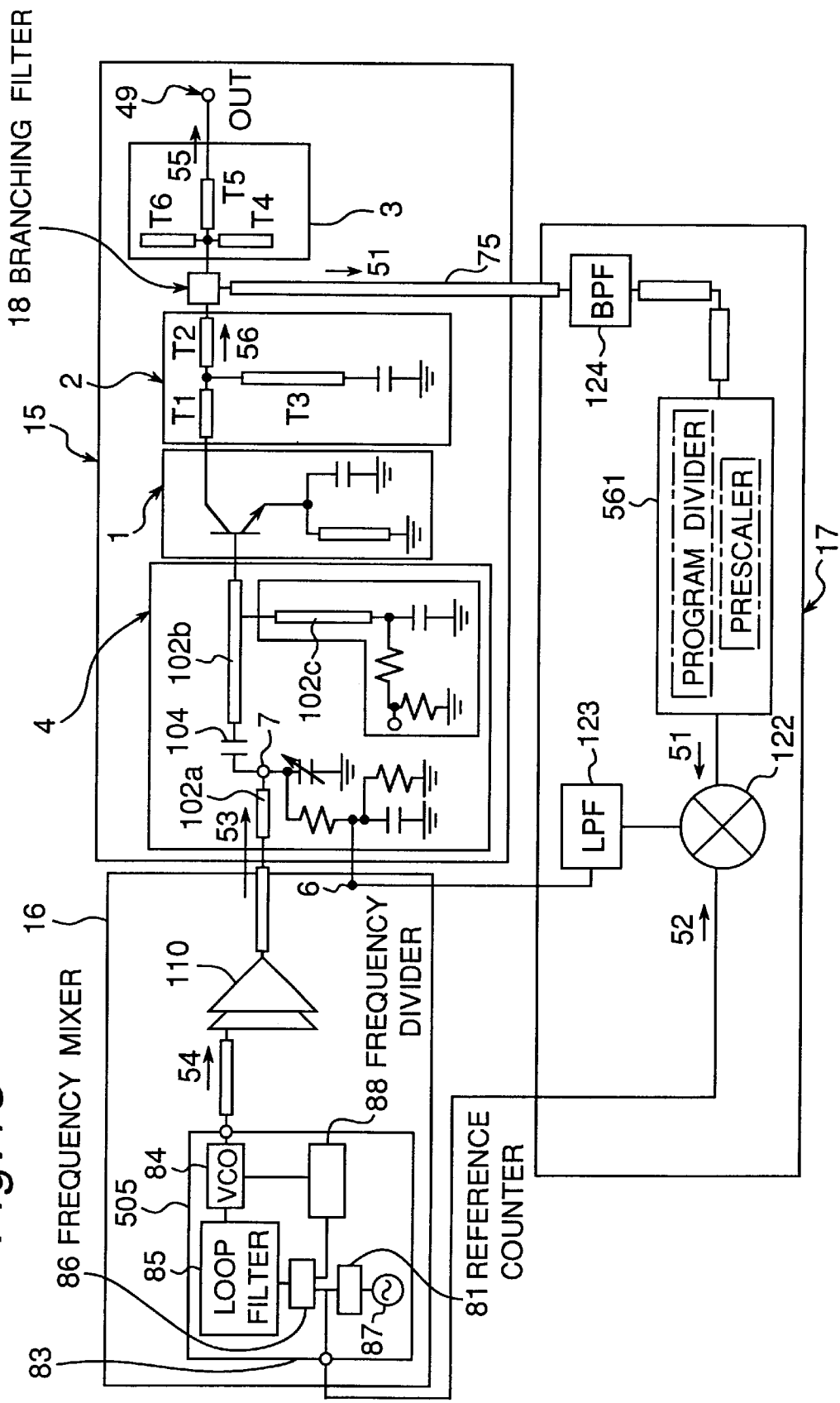
FIG. 13 shows the circuit construction of an eighth embodiment of the present invention.
Figure 14:
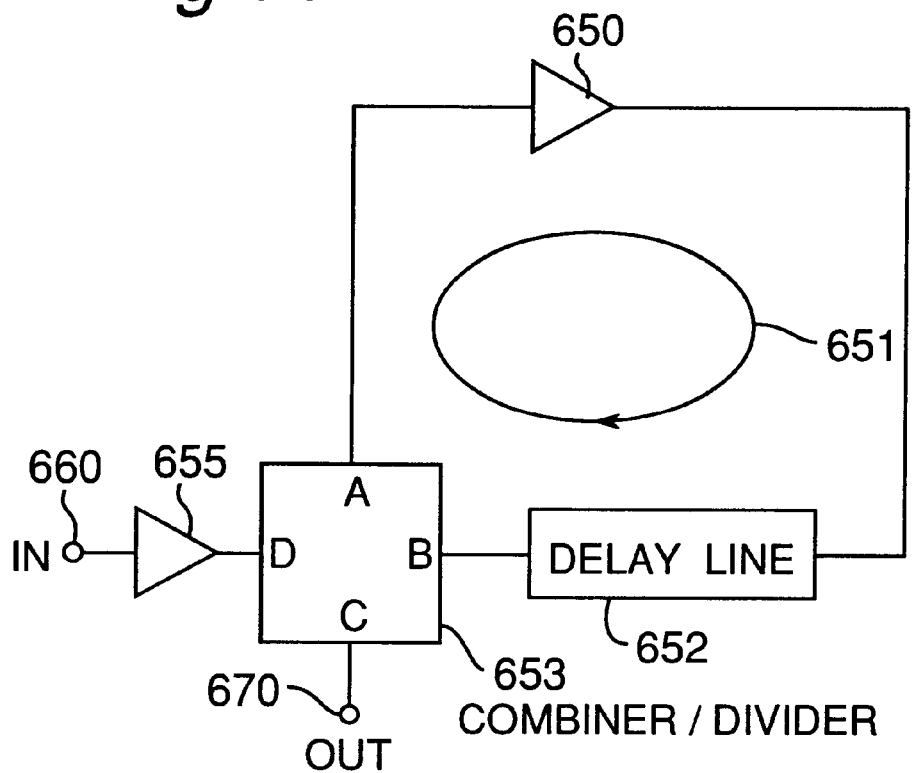
FIG. 14 shows an example of the construction of a conventional microwave injection locked oscillator.

FIG. 13 shows the construction of an eighth embodiment of the present invention. Similarly to the seventh embodiment, the microwave/millimeter-wave injection locked oscillator of the eighth embodiment has a frequency negative feedback loop. Thus, parts in FIG. 13 same as those in FIG. 12 are designated by the same reference numerals as those of FIG. 12, and different parts are described mainly.

The eighth embodiment is different from the seventh embodiment only in the construction of a signal generator 505 and a frequency divider 561.

That is, in the eighth embodiment, by using a divider 561 composed of a prescaler and a programmable divider, a signal frequency-divided by more than 10000 is allowed to be inputted to the frequency mixer 122.

In the eighth embodiment, a semi-microwave band reference signal generator 505 composed of a phase locking oscillator is used. The reference signal generator 505 is constructed of a voltage control oscillator 84, a frequency divider 85, a crystal oscillator (temperature-control crystal oscillator) 87, and a reference counter 81, a frequency mixer 82, and a loop filter 88. A reference signal is outputted from the reference counter 81 to a reference signal output point 83 to serve as a comparison reference signal in the frequency mixer 122.

A signal 54 outputted from the voltage control oscillator 84 of the reference signal generator 505 is passed through the hth (h: integer) harmonic amplifier 110 and injected into one end of the transmission line 102*a* of the resonant circuit 4. From the output portion 49 of the oscillation circuit 15, a signal whose frequency is n×f (=n×h×fo) is outputted.

For example, supposing that the fundamental oscillation frequency of the oscillation circuit 15 is 15 GHz, it is possible to derive a frequency-stable signal of 60 GHz with a low phase noise from the output portion 49. The signal derived has characteristics which are governed by the frequency stability and a low phase noise characteristic of the reference signal generator 505 (namely, characteristics which are governed by the frequency stability and the low phase noise characteristic of crystal oscillator 87).

According to the construction of the eighth embodiment, high frequency signals are propagated from the branching filter 18 to the frequency divider 561, while signals having frequencies of the order of KHz–MHz are propagated through wiring provided from the divider 561 to the frequency mixer 122 and wiring from the reference signal output point 83 to the frequency mixer 122. Thus, the construction of the eighth embodiment has an advantage that the wiring for signal propagation and an assembling work such as mounting can be accomplished very easily.

In the present embodiment, the signal 53 outputted from the injection circuit 16 is injected into one end of the transmission line 102*a*, but alternatively, may be injected into either end of the capacitance element 104. Further, the signal 53 may be injected into either end of the transmission line 102*a* or 102*b*.

INDUSTRIAL APPLICABILITY

As described above, the microwave/millimeter-wave injection locked oscillator of the present invention is used as a communications apparatus for transmitting a large volume mount of analog and digital information at a high speed by radio.

What is claimed is:

1. A microwave/millimeter-wave injection locked oscillator, comprising:
    an oscillation circuit (15) having an active element section (1), a resonant circuit (4) connected to the active element section (1) at an input side thereof and resonating at a predetermined frequency f, and a harmonic output circuit (3) connected to the active element section (1) at the output side thereof to provide a signal at output means (49) having an nth (n: an integer $\geq 2$) harmonic component of a signal having the frequency f from the resonant circuit (4);
    an injection circuit (16) generating a reference signal for frequency-locking a signal in the resonant circuit (4); and
    input means (7) comprised of a signal input terminal located between the injection circuit (16) and the resonant circuit (4) for coupling the reference signal generated by the injection circuit (16) to the resonant circuit (4) connected to the input side of the active element section (1).

2. The microwave/millimeter-wave injection locked oscillator as set forth in claim 1, wherein the resonant circuit (4) includes a transmission line (T7, 102*a*, 102*b*, 102*c*) and a capacitance element (22, 23, 32, 33, 34, 101, 104), the input means (7) is provided at one end of the transmission line (T7, 102*a*, 102*b*) or the capacitance element (22, 23, 32, 33, 34, 101), and the reference signal has a frequency component of f/m (m: an integer).

3. The microwave/millimeter-wave injection locked oscillator as set forth in claim 1, wherein the injection circuit (16) includes a crystal oscillator of a low frequency.

4. The microwave/millimeter-wave injection locked oscillator as set forth in claim 2, wherein the injection circuit (16) has a signal generator (5) and a wide-band non-linear amplifier (8) having an amplification degree between a frequency of f/m and a frequency of nf.

5. The microwave/millimeter-wave injection locked oscillator as set forth in claim 4, wherein the injection circuit (16) further comprises an h-multiplier (h: an integer) (9) connected between the signal generator (5) and the wide-band non-linear amplifier (8).

6. The microwave/millimeter-wave injection locked oscillator as set forth in claim 2, wherein the capacitance element (23, 32) of the resonant circuit (4) is made up of two varactor diodes (23, 32) connected in series with each other in reverse orientations, and a signal outputted from the injection circuit (16) is injected into a node (25) between the two varactor diodes (23, 32).

7. The microwave/millimeter-wave injection locked oscillator as set forth in claim 2, wherein the capacitance element (33) of the resonant circuit (4) is constituted of a microwave transistor (33) between two terminals (E, C) thereof, and a signal outputted from the injection circuit (16) is injected into the other terminal (B).

8. The microwave/millimeter-wave injection locked oscillator as set forth in claim 2, wherein the capacitance element (33, 34) of the resonant circuit is constituted of two microwave transistors (33, 34) in which collector terminals and base terminals thereof (C, B) are commonly connected, one emitter terminal (E) is connected with a transmission line, and the other emitter terminal (E) is grounded, and a signal outputted from the injection circuit (16) is injected into the commonly connected collector and base terminals (C, B).

9. The microwave/millimeter-wave injection locked oscillator as set forth in claim 1, wherein the injection circuit (16) further has a reference signal generator (5, 505) generating the reference signal, and the resonant circuit (15) has a branching filter (18) provided at an output side of the resonant circuit (4),
    the microwave/millimeter-wave injection locked oscillator further comprising:
    a frequency negative feedback loop (17) having a frequency mixer (122) to which a signal (51) outputted from the branching filter (18) and a signal (52) outputted from the reference signal generator (5, 505) are inputted, wherein said frequency negative feedback loop feeds back an error signal (55) outputted from the frequency mixer (122) to the resonant circuit (4) to thereby frequency-lock the resonant circuit (4) to a signal outputted from the reference signal generator (5, 505).

10. The microwave/millimeter-wave injection locked oscillator as set forth in claim 9, comprising a distributor (13, 311) which distributes the signal (54) outputted from the reference signal generator (5) to the input means (7) and the frequency mixer (122).

11. The microwave/millimeter-wave injection locked oscillator as set forth in claim 10, wherein the frequency negative feedback loop (17) has an m-multiplier (121, 221) connected between the distributor (13) and the frequency mixer (122).

12. The microwave/millimeter-wave injection locked oscillator as set forth in claim 11, wherein the oscillation circuit (15) has the nth harmonic matching circuit (3) connected with the branching filer (18) for fetching the nth harmonic from the resonant circuit (4).

13. The microwave/millimeter-wave injection locked oscillator as set forth in claim 10, comprising an hth harmonic amplifier (110) connected between the reference signal generator (5) and the distributor (13).

14. The microwave/millimeter-wave injection locked oscillator as set forth in claim 13, comprising an m-multiplier (221) connected between the distributor (13) and the frequency mixer (122).

15. The microwave/millimeter-wave injection locked oscillator as set forth in claim 10, comprising:

an hth harmonic amplifier (110) connected between the distributor (311) and the input means (7); and a frequency divider (61, 561) connected between the branching filter (18) and the frequency mixer (122).

16. The microwave/millimeter-wave injection locked oscillator as set forth in claim 1 and additionally including a reflection feedback control circuit (2) connected between the output side of the active element section (1) and an input side of the harmonic output circuit (3) opposite the output means (49).

17. A microwave/millimeter-wave injection locked oscillator, comprising:

an oscillation circuit (15) having an active element section (1), a resonant circuit (4) connected to the active element section (1) at an input side thereof and resonating at a predetermined frequency f, and a harmonic output circuit (3) connected to the active element section (1) at the output side thereof to provide a signal at output means (49) having an nth (n: an integer $\geq 2$) harmonic component of a signal having the frequency f from the resonant circuit (4);

an injection circuit (16) generating a reference signal for frequencylocking a signal in the resonant circuit (4); and input means (7) comprised of a signal input terminal located between the injection circuit (16) and the resonant circuit (4) for coupling the reference signal generated by the injection circuit (16) to the resonant circuit (4) connected to the input side of the active element section (1); and a reflection feedback control circuit (2) connected between the output side of the active element section (1) and an input side of the harmonic output circuit (3) opposite the output means (49).

\* \* \* \* \*